US012608785B1

(12) United States Patent
Zhang et al.

(10) Patent No.: US 12,608,785 B1
(45) Date of Patent: Apr. 21, 2026

(54) NON-CONTACT LIVE DETECTION APPARATUS AND LIVE DETECTION METHOD

(71) Applicants: STATE GRID JIANGSU TAIZHOU POWER SUPPLY COMPANY, Taizhou (CN); STATE GRID JIANGSU ELECTRIC POWER CO., LTD., Nanjing (CN)

(72) Inventors: Ze Zhang, Taizhou (CN); Shuheng Wang, Taizhou (CN); Ling Ju, Taizhou (CN); Danyin Wen, Taizhou (CN); Sen Yang, Taizhou (CN); Xiaoyun Liao, Taizhou (CN); Lijian Ouyang, Taizhou (CN); Jun Xu, Taizhou (CN); Yanquan Zhu, Taizhou (CN); Hui Qi, Taizhou (CN)

(73) Assignees: STATE GRID JIANGSU TAIZHOU POWER SUPPLY COMPANY, Taizhou (CN); STATE GRID JIANGSU ELECTRIC POWER CO., LTD., Nanjing (CN)

( * ) Notice: Subject to any disclaimer, the term of this patent is extended or adjusted under 35 U.S.C. 154(b) by 397 days.

(21) Appl. No.: 18/565,729

(22) PCT Filed: Oct. 27, 2023

(86) PCT No.: PCT/CN2023/127016
§ 371 (c)(1),
(2) Date: Nov. 30, 2023

(87) PCT Pub. No.: WO2025/000772
PCT Pub. Date: Jan. 2, 2025

(30) Foreign Application Priority Data

Jun. 25, 2023 (CN) ......................... 202310750084.X

(51) Int. Cl.
*G06T 7/00* (2017.01)
*G01R 31/08* (2020.01)
(Continued)

(52) U.S. Cl.
CPC .......... *G06T 7/0002* (2013.01); *G01R 31/085* (2013.01); *G01R 31/088* (2013.01);
(Continued)

(58) Field of Classification Search
None
See application file for complete search history.

(56) References Cited

U.S. PATENT DOCUMENTS

2023/0152362 A1* 5/2023 Tilles ................. G01R 29/0885
324/551

FOREIGN PATENT DOCUMENTS

CN 202614892 U 12/2012
CN 108956640 A 12/2018
(Continued)

OTHER PUBLICATIONS

Ju, Zeli, et al. "Development of PD Detection Technique of Overhead distribution lines using UHF and ultrasonic." 2020 6th Global Electromagnetic Compatibility Conference (GEMCCON). IEEE, 2020 (Year: 2020).*

(Continued)

*Primary Examiner* — Henok Shiferaw
*Assistant Examiner* — Xiaomao Ding
(74) *Attorney, Agent, or Firm* — CM Law; Stephen J. Weed

(57) ABSTRACT

Provided are a non-contact live detection apparatus and a live detection method. The non-contact live detection apparatus includes a processing unit and a detection unit and an image collection unit which are both communicatively connected to the processing unit. The detection unit includes an (Continued)

Insulators and cable switching terminals

Partial discharge

Detection apparatus

Ultrasonic signal and electromagnetic signal electromagnetic wave sensor and at least three ultrasonic sensors. The image collection unit is configured to collect an insulation defect picture of an overhead power line detected by the detection unit. The processing unit is configured to obtain the spatial coordinates, two-dimensional pixel coordinates, electromagnetic wave intensity, and ultrasonic intensity of an insulation defect location according to a detection result of the detection unit and perform identification on the insulation defect picture.

20 Claims, 9 Drawing Sheets

(51) Int. Cl.
G06T 7/73 (2017.01)
H04B 3/46 (2015.01)
(52) U.S. Cl.
CPC ...... G06T 7/73 (2017.01); G06T 2207/30184 (2013.01); G06T 2207/30204 (2013.01); H04B 3/46 (2013.01)

(56) References Cited

FOREIGN PATENT DOCUMENTS

| CN | 113030671 A | 6/2021 | | |
| CN | 113884834 A | 1/2022 | | |
| CN | 215493946 U | 1/2022 | | |
| CN | 114113927 A | * | 3/2022 | ............ G01R 31/12 |
| CN | 111443267 A | 11/2022 | | |
| CN | 116794451 A | 9/2023 | | |
| KR | 101627429 B1 | 6/2016 | | |
| WO | 2011118923 A2 | 9/2011 | | |

OTHER PUBLICATIONS

Samaitis, Vykintas, et al. "Detection and localization of partial discharge in connectors of air power lines by means of ultrasonic measurements and artificial intelligence models." Sensors 21.1 (2020): 20 (Year: 2020).*

Tao, Jiaqi, et al. "A Novel PD Detection Device for Overhead Distribution Lines Based on Ultrasound and UHF." 2021 6th International Conference on Power and Renewable Energy (ICPRE). IEEE, 2021 (Year: 2021).*

Tao, Jiaqi, et al. "Research on TDOA calculation algorithms of ultrasonic signal for PD." 2022 IEEE 6th Information Technology and Mechatronics Engineering Conference (ITOEC). vol. 6. IEEE, 2022 (Year: 2022).*

Chinese Notice of Grant or CN 202310750084.X dated Apr. 21, 2024 (Apr. 21, 2024)—4 pages (English translation—4 pages).

International Search Report for PCT/CN2023/127016 dated Feb. 9, 2024 (Feb. 9, 2024), 2 pages (English translation—3 pages).

Lie, Hankun et al.: "Research on Combined Method of Ultra High Frequency and X☐ray Digital Imaging for Detecting Internal Discharge Defects of GIS Solid Insulation," High Voltage Apparatus, vol. 54, No. 1, pp. 224-229, Jan. 16, 2018.

* cited by examiner

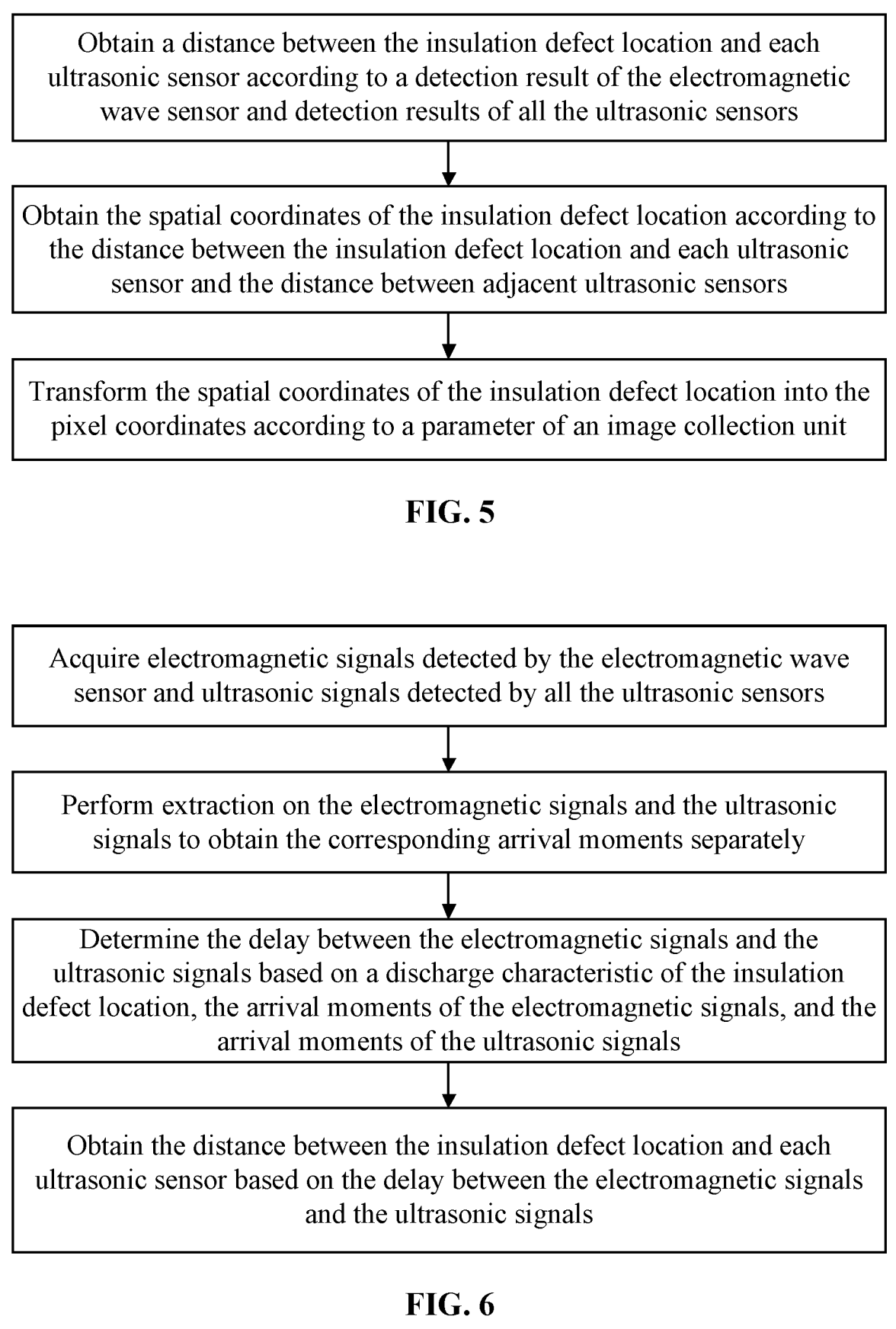

Obtain a distance between the insulation defect location and each ultrasonic sensor according to a detection result of the electromagnetic wave sensor and detection results of all the ultrasonic sensors

↓

Obtain the spatial coordinates of the insulation defect location according to the distance between the insulation defect location and each ultrasonic sensor and the distance between adjacent ultrasonic sensors

↓

Transform the spatial coordinates of the insulation defect location into the pixel coordinates according to a parameter of an image collection unit

FIG. 5

Acquire electromagnetic signals detected by the electromagnetic wave sensor and ultrasonic signals detected by all the ultrasonic sensors

↓

Perform extraction on the electromagnetic signals and the ultrasonic signals to obtain the corresponding arrival moments separately

↓

Determine the delay between the electromagnetic signals and the ultrasonic signals based on a discharge characteristic of the insulation defect location, the arrival moments of the electromagnetic signals, and the arrival moments of the ultrasonic signals

↓

Obtain the distance between the insulation defect location and each ultrasonic sensor based on the delay between the electromagnetic signals and the ultrasonic signals

FIG. 6

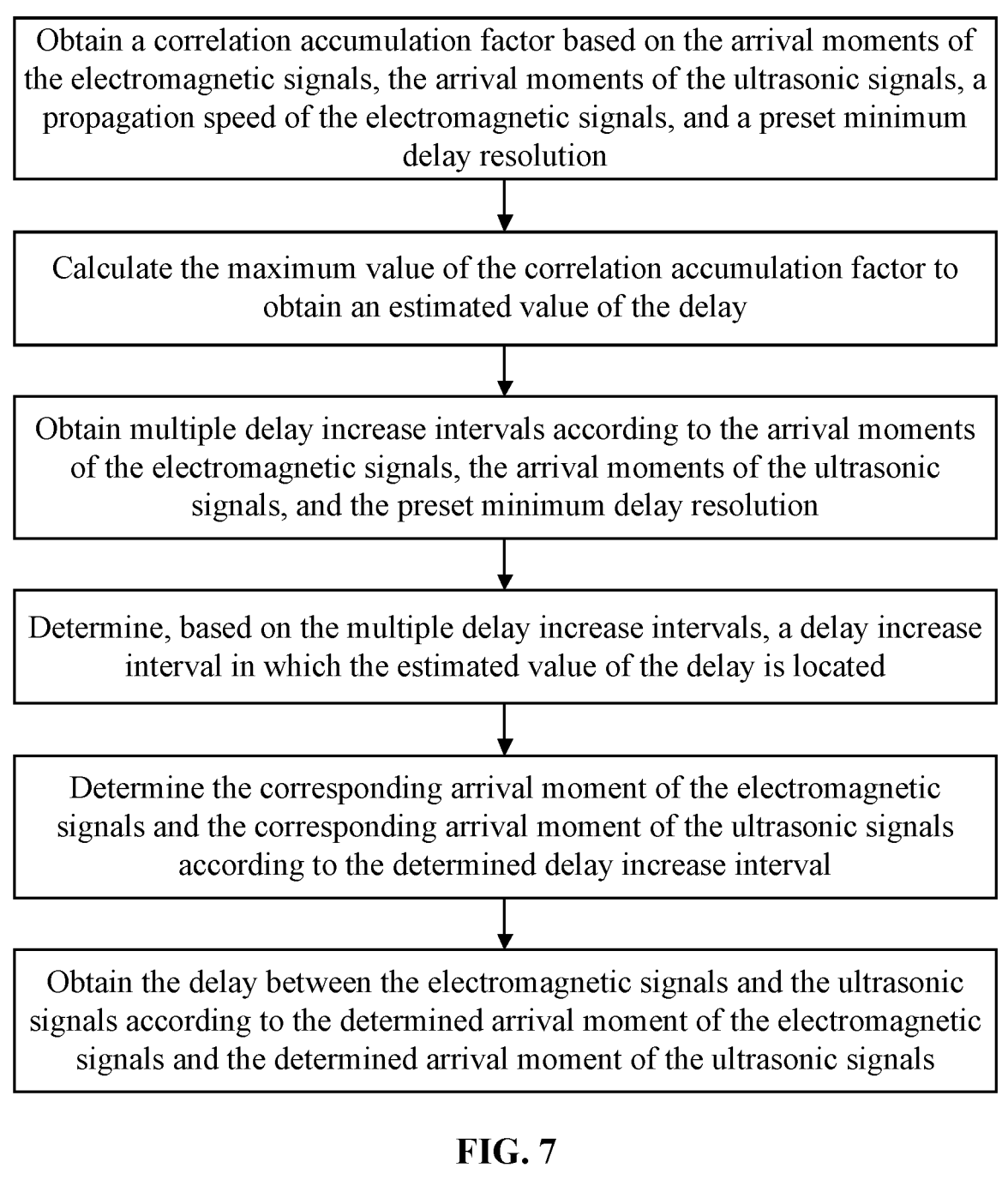

Obtain a correlation accumulation factor based on the arrival moments of the electromagnetic signals, the arrival moments of the ultrasonic signals, a propagation speed of the electromagnetic signals, and a preset minimum delay resolution Calculate the maximum value of the correlation accumulation factor to obtain an estimated value of the delay Obtain multiple delay increase intervals according to the arrival moments of the electromagnetic signals, the arrival moments of the ultrasonic signals, and the preset minimum delay resolution Determine, based on the multiple delay increase intervals, a delay increase interval in which the estimated value of the delay is located Determine the corresponding arrival moment of the electromagnetic signals and the corresponding arrival moment of the ultrasonic signals according to the determined delay increase interval Obtain the delay between the electromagnetic signals and the ultrasonic signals according to the determined arrival moment of the electromagnetic signals and the determined arrival moment of the ultrasonic signals

FIG. 7

Obtain a delay between different ultrasonic signals based on a high-order cumulant method and ultrasonic signals detected by all the ultrasonic sensors Obtain the distance between each ultrasonic sensor and the insulation defect location according to the delay between different ultrasonic signals Establish a three-dimensional spatial coordinate system, and obtain a spatial coordinate relationship of the insulation defect location according to the distance between adjacent ultrasonic sensors Determine the spatial coordinates of the insulation defect location according to the distance between each ultrasonic sensor and the insulation defect location in conjunction with the spatial coordinate relationship

FIG. 8

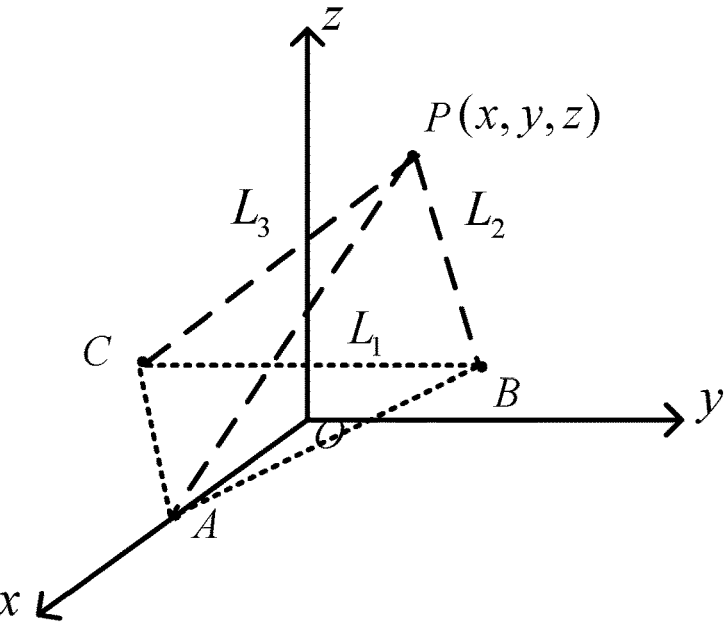

FIG. 9

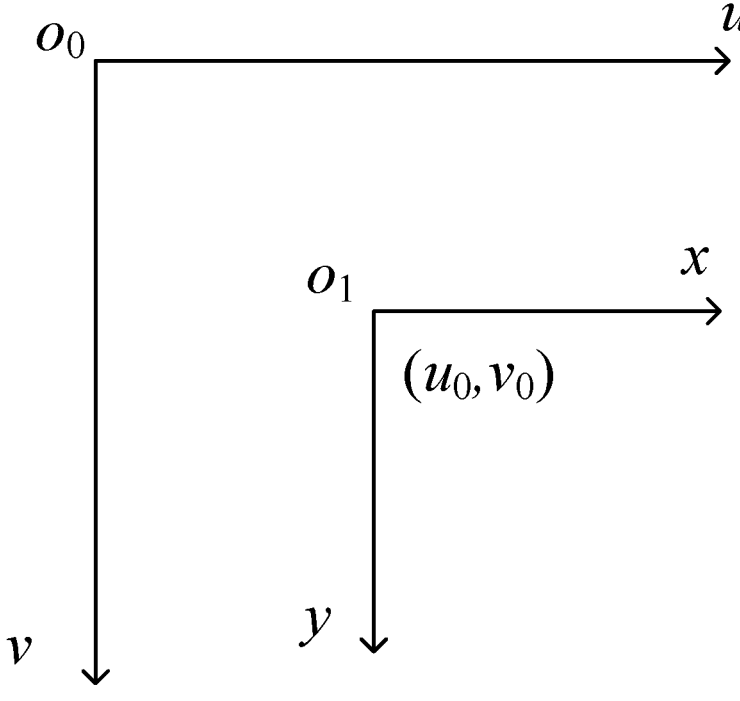

FIG. 12

Detect, by a detection unit, an overhead power line, and collect, by an image collection unit, an image of the overhead power line in a predetermined direction to obtain an insulation defect picture Obtain the spatial coordinates, two-dimensional pixel coordinates, electromagnetic wave intensity, and ultrasonic intensity of an insulation defect location according to a detection result of the detection unit Preform identification on the insulation defect picture according to the spatial coordinates, the two-dimensional pixel coordinates, the electromagnetic wave intensity, and the ultrasonic intensity

FIG. 13

Insulators and cable switching terminals

Partial discharge

Ultrasonic signal and electromagnetic signal

Detection apparatus

NON-CONTACT LIVE DETECTION APPARATUS AND LIVE DETECTION METHOD

CROSS-REFERENCE TO RELATED APPLICATIONS

This is a National Stage Application, filed under 35 U.S.C. 371, of International Patent Application No. PCT/CN2023/127016, filed on Oct. 27, 2023, which claims priority to Chinese Patent Application No. 202310750084.X filed with the China National Intellectual Property Administration (CNIPA) on Jun. 25, 2023, the disclosures of which are incorporated herein by reference in their entireties.

TECHNICAL FIELD

The present application relates to the technical field of distribution network fault positioning, for example, a non-contact live detection apparatus and a live detection method.

BACKGROUND

Overhead power lines for power distribution are major arteries for the operation of a power system and play the role of connecting power transmission lines to end users. In a power distribution system, the overhead power lines are widely applied to medium-voltage power distribution networks. The overhead power lines pass through urban roadsides and woodlands in fields to distribute and transmit electrical energy to users and have the characteristics of long line mileage, various types of equipment and a large amount of equipment along the lines, and the like. Since the overhead power lines for power distribution are widely applied in rural areas, suburban areas, and some urban areas and are exposed to the open air for many years and subjected to wind and sunshine, insulators and cable switching terminals in the lines are affected by a series of unfavorable conditions, such as bird damage, environment pollution, and severe weather conditions. After an insulation defect of an insulator and an insulation defect of a cable switching terminal are generated, if the insulation defects are not handled in time, the insulation defects may cause a serious power failure accident, resulting in great economic losses. Therefore, it is of great practical significance to detect the insulation defects of insulators and cable switching terminals of the overhead power lines for power distribution.

Ultrasonic detection instruments are mainly used for detecting the insulation defects of insulators and cable switching terminals of the overhead power lines for power distribution. There are mainly two types of ultrasonic detection apparatuses used: ultrasonic imagers and detection apparatuses of a wave-focusing device type. A detection apparatus of the wave-focusing device type focuses ultrasonic waves using a wave-focusing device and can improve the sensitivity and directionality of ultrasonic detection. However, when a large amount of power equipment exists in a detection area, the detection apparatus of the wave-focusing device type cannot position equipment with an insulation defect. Based on the acoustic imaging theory, an ultrasonic imager detects the distribution of sound field over an entire acoustic plane using a microphone array so that insulation defects are accurately identified. However, limited by a system structure, the ultrasonic imager has relatively poor sensitivity. In addition, these two detection apparatuses are both sensitive to a detection distance. When the apparatuses are relatively close to the insulation defect, the ultrasonic detection intensity is high, and when the apparatuses are relatively far from the insulation defect, the ultrasonic detection intensity is low. Therefore, the preceding ultrasonic detection apparatuses are greatly affected by the detection distance, and there is no unified reference for determining the severity of the insulation defect.

CN111443267A discloses an enhanced apparatus and an enhanced method for inspecting a partial discharge of a 10-kV insulated overhead power line, where the enhanced apparatus includes an ultrasonic sensor, an ultra-high-frequency antenna sensor, an ultrasonic amplification and filter circuit, an ultra-high-frequency amplification and filter circuit, a detection circuit, a dual-channel analog-to-digital (A/D) converter, an advanced reduced instruction-set computer (RISC) machine (ARM), microprocessor, and a memory card. This apparatus is mainly aimed at the poor anti-interference capability and low efficiency of a single ultrasonic detection apparatus, and the ultra-high-frequency antenna sensor is added to detect the partial discharge of an overhead power line in both an ultrasonic detection manner and an electrical signal detection manner. However, the preceding scheme still has the following disadvantages. Firstly, in the preceding disclosed scheme, the shape of a wave-focusing device is roughly described, the design of the ultrasonic wave-focusing device is not analyzed, and no optimal design on the shape and dimension of the wave-focusing device is provided, so the capability of the detection apparatus to resist external interference cannot be greatly improved. Secondly, in the preceding disclosed scheme, no method for calculating the distance of a defect is provided, the spatial coordinates of the defect cannot be located, and the visualization of the defect and corresponding defect parameters cannot be implemented. As a result, the preceding disclosed scheme is not intuitive and has low on-site application efficiency. Thirdly, the original ultrasonic detection intensity is directly used in the preceding disclosed scheme, and under the action of the attenuation of an ultrasonic wave, a difference between different detection distances exists in the evaluation of the discharge intensity of the insulation defect. As a result, the preceding disclosed scheme is greatly affected by the detection distance, and a unified reference standard cannot be established for determining the discharge intensity of the insulation defect.

Therefore, it is urgent to study the technology for detecting the insulation defects of insulators and cable switching terminals of the overhead power lines for power distribution to implement the efficient, flexible, accurate, and visualized insulation defect detection and evaluation.

SUMMARY

The present application provides a non-contact live detection apparatus and a live detection method so that the spatial coordinates of an insulation defect can be located, the accuracy with which the discharge intensity of the insulation defect is evaluated is improved, and the visualization of the insulation defect is implemented.

The present application provides a non-contact live detection apparatus including a processing unit, a detection unit and an image collection unit which are both communicatively connected to the processing unit.

The detection unit includes an electromagnetic wave sensor and at least three ultrasonic sensors.

The image collection unit is configured to collect an insulation defect picture of an overhead power line detected by the detection unit.

The processing unit is configured to obtain spatial coordinates, two-dimensional pixel coordinates, electromagnetic wave intensity, and ultrasonic intensity of an insulation defect location according to a detection result of the detection unit and identify the insulation defect picture.

In an embodiment, the detection apparatus includes a detection base plate, the detection unit and the image collection unit are fixed onto the detection base plate, the image collection unit is disposed at the geometric center of all the ultrasonic sensors, and the collection direction of the image collection unit is the same as the detection direction of the ultrasonic sensors.

In an embodiment, the detection apparatus includes a data collection unit communicatively connected to the processing unit, and the data collection unit converts an ultrasonic signal of the ultrasonic sensor and an electromagnetic wave signal of the electromagnetic wave sensor into digital signals.

In an embodiment, an ultrasonic wave-focusing device is fixed onto the ultrasonic sensor, the ultrasonic wave-focusing device has the shape of a paraboloid, and the ratio of the focal length of the paraboloid to the radius of the ultrasonic sensor is 1:2.

In an embodiment, the detection apparatus includes ultrasonic conditioning circuits whose number matches the number of ultrasonic sensors, and each ultrasonic conditioning circuit includes a noise amplification circuit and an amplification and filter circuit which are connected to each other. An input terminal of the noise amplification circuit is connected to the ultrasonic sensor, and the noise amplification circuit is configured to perform signal amplification on a detection result of the ultrasonic sensor. An output terminal of the amplification and filter circuit is connected to the processing unit, and the amplification and filter circuit is configured to amplify and filter a signal outputted from the noise amplification circuit.

In an embodiment, the noise amplification circuit includes an instrumentation amplifier, a first positive power supply circuit, and a first negative power supply circuit.

A positive input pin and a negative input pin of the instrumentation amplifier are connected to the ultrasonic sensor, the positive input pin is connected to a first resistance and then grounded, the positive input pin and the negative input pin are connected to each other via a second resistance, the negative input pin is connected to the third resistance and then grounded, and a fourth resistance is connected between two gain-setting pins of the instrumentation amplifier.

The first positive power supply circuit includes a first anti-interference device and a first grounded capacitor. The two sides of the first anti-interference device are connected to a positive power supply and a positive power supply pin of the instrumentation amplifier separately, and the two sides of the first grounded capacitor are grounded and connected to the positive power supply pin of the instrumentation amplifier separately.

The first negative power supply circuit includes a second anti-interference device and a second grounded capacitor. The two sides of the second anti-interference device are connected to a negative power supply and a negative power supply pin of the instrumentation amplifier separately, and the two sides of the second grounded capacitor are grounded and connected to the negative power supply pin of the instrumentation amplifier separately.

An output pin of the instrumentation amplifier is connected to a fifth capacitor and then to the amplification and filter circuit.

In an embodiment, the amplification and filter circuit may include an operational amplifier, a second positive power supply circuit, and a second negative power supply circuit.

A first signal negative input pin of the operational amplifier is connected to an output terminal of the noise amplification circuit via a sixth resistance, a first signal positive input pin of the operational amplifier is connected to a seventh resistance and then grounded, a first output pin of the operational amplifier is connected to the first signal negative input pin via a sixth capacitor, the first output pin of the operational amplifier is connected to the output terminal of the noise amplification circuit via a fifth resistance, the first output pin of the operational amplifier is connected to a seventh capacitor, a ninth resistance, and an eighth capacitor sequentially in series and is then connected to a second output pin of the operational amplifier, the second output pin of the operational amplifier is connected between the seventh capacitor and the ninth resistance via an eighth resistance, a second signal negative input pin of the operational amplifier is connected between the ninth resistance and the eighth capacitor, a second signal positive input pin of the operational amplifier is connected to a tenth resistance and then grounded, and the second output pin of the operational amplifier is connected to the processing unit.

The second positive power supply circuit includes a fourth anti-interference device and a third grounded capacitor. The two sides of the fourth anti-interference device are connected to the positive power supply and a positive power supply pin of the operational amplifier separately, and an eleventh capacitor is connected in parallel to a twelfth capacitor and then two sides of the eleventh capacitor are grounded and connected to the positive power supply pin of the operational amplifier separately.

The second negative power supply circuit includes a third anti-interference device and a fourth grounded capacitor. The two sides of the third anti-interference device are connected to the negative power supply and a negative power supply pin of the operational amplifier separately, and a ninth capacitor is connected in parallel to a tenth capacitor and then two sides of the ninth capacitor are grounded and connected to the negative power supply pin of the operational amplifier separately.

In an embodiment, the detection apparatus includes an electromagnetic conditioning circuit. An input terminal of the electromagnetic conditioning circuit is connected to the electromagnetic wave sensor, an output terminal of the electromagnetic conditioning circuit is connected to the processing unit, and the electromagnetic conditioning circuit is configured to filter a detection result of the electromagnetic wave sensor.

In an embodiment, the input terminal of the electromagnetic conditioning circuit includes a first alternating current input terminal and a second alternating current input terminal, and the output terminal of the electromagnetic conditioning circuit includes a first alternating current output terminal and a second alternating current output terminal. The first alternating current input terminal is connected to the first alternating current output terminal via a first resistance, a first capacitor, a first inductor, a third capacitor, a third inductor, a fifth capacitor, a fifth inductor, a seventh capacitor, and a seventh inductor which are sequentially connected in series, the second alternating current input terminal is connected to the second alternating current output terminal, the second alternating current input terminal is connected between the first inductor and the third capacitor via a parallel connection of a second inductor and a second capacitor, the second alternating current input terminal is connected between the third inductor and the fifth capacitor via a parallel connection of a fourth inductor and a fourth capacitor, and the second alternating current input terminal is connected between the fifth inductor and the seventh capacitor via a parallel connection of a sixth inductor and a sixth capacitor. The first alternating current output terminal is connected to the second alternating current output terminal via a second resistance.

In an embodiment, the step of obtaining the spatial coordinates and the two-dimensional pixel coordinates of the insulation defect location according to the detection result of the detection unit includes the steps described below.

A distance between the insulation defect location and each ultrasonic sensor is obtained according to a detection result of the electromagnetic wave sensor and detection results of all the ultrasonic sensors.

The spatial coordinates of the insulation defect location are obtained according to the distance between the insulation defect location and each ultrasonic sensor and a distance between adjacent ultrasonic sensors.

The spatial coordinates of the insulation defect location are transformed into the pixel coordinates according to a parameter of the image collection unit.

In an embodiment, the step of obtaining the distance between the insulation defect location and each ultrasonic sensor according to the detection result of the electromagnetic wave sensor and the detection results of all the ultrasonic sensors includes the steps described below.

Electromagnetic signals detected by the electromagnetic wave sensor and ultrasonic signals detected by all the ultrasonic sensors are acquired.

The electromagnetic signals and the ultrasonic signals are subjected to the extraction so that corresponding arrival moments are obtained separately.

A delay between the electromagnetic signals and the ultrasonic signals is determined based on a discharge characteristic of the insulation defect location, the arrival moments of the electromagnetic signals, and the arrival moments of the ultrasonic signals.

The distance between the insulation defect location and each ultrasonic sensor is obtained based on the delay between the electromagnetic signals and the ultrasonic signals.

In an embodiment, the step of performing the extraction on the ultrasonic signals to obtain the corresponding arrival moment includes the steps described below.

The average energy of the ultrasonic signals is obtained according to the ultrasonic signals detected for a duration.

The duration is divided into multiple first preset time periods.

An energy curve of the ultrasonic signals is obtained according to the average energy of the ultrasonic signals and energy of ultrasonic signals within a first preset time period.

An ultrasonic signal corresponding to the minimal value of the energy curve of the ultrasonic signals within the first preset time period is screened out according to the energy curve of the ultrasonic signals in the first preset time period.

An arrival moment of the ultrasonic signal is obtained according to the ultrasonic signal corresponding to the minimal value of the energy curve of the ultrasonic signals.

The step of performing the extraction on the electromagnetic signals to obtain the corresponding arrival moment includes the steps described below.

A threshold scaling coefficient with which the electromagnetic wave sensor detects the electromagnetic signals is obtained according to a signal-to-noise ratio of the electromagnetic wave sensor.

An electromagnetic detection threshold is obtained according to the threshold scaling coefficient and the electromagnetic signals within the duration.

The duration is divided into multiple second preset time periods.

An electromagnetic signal which reaches the electromagnetic detection threshold for the first time within a second preset time period is screened out according to the multiple second preset time periods and the electromagnetic detection threshold.

A corresponding arrival moment is determined according to the electromagnetic signal reaching the electromagnetic detection threshold for the first time.

In an embodiment, the step of determining the delay between the electromagnetic signals and the ultrasonic signals based on the discharge characteristic of the insulation defect location, the arrival moments of the electromagnetic signals, and the arrival moments of the ultrasonic signals includes the steps described below.

A correlation accumulation factor is obtained based on the arrival moments of the electromagnetic signals, the arrival moments of the ultrasonic signals, a propagation speed of the electromagnetic signals, and a preset minimum delay resolution.

The maximum value of the correlation accumulation factor is calculated so that an estimated value of the delay is obtained.

Multiple delay increase intervals are obtained according to the arrival moments of the electromagnetic signals, the arrival moments of the ultrasonic signals, and the preset minimum delay resolution.

A delay increase interval in which the estimated value of the delay is located is determined based on the multiple delay increase intervals.

The corresponding arrival moment of the electromagnetic signals and the corresponding arrival moment of the ultrasonic signals are determined according to the determined delay increase interval.

The delay between the electromagnetic signals and the ultrasonic signals is obtained according to the given arrival moment of the electromagnetic signals and the given arrival moment of the ultrasonic signals.

In an embodiment, the step of obtaining the spatial coordinates of the insulation defect location according to the distance between the insulation defect location and the ultrasonic sensor and the detection results of all ultrasonic sensors includes the steps described below.

A delay between different ultrasonic signals is obtained based on a high-order cumulant method and the ultrasonic signals detected by all the ultrasonic sensors.

The distance between each ultrasonic sensor and the insulation defect location is obtained according to the delay between different ultrasonic signals.

A three-dimensional spatial coordinate system is established, and a spatial coordinate relationship of the insulation defect location is obtained according to the distance between adjacent ultrasonic sensors.

The spatial coordinates of the insulation defect location are determined according to the distance between each ultrasonic sensor and the insulation defect location in conjunction with the spatial coordinate relationship.

In an embodiment, the step of obtaining the delay between different ultrasonic signals based on the high-order cumulant method and the ultrasonic signals detected by all the ultrasonic sensors includes the steps described below.

All the ultrasonic sensors are combined in pairs to form multiple ultrasonic sensor groups.

A cumulant coefficient is constructed for ultrasonic signals detected by each ultrasonic sensor group.

The maximum value of all cumulant coefficients is calculated so that the delay between ultrasonic signals detected by two ultrasonic sensors in each ultrasonic sensor group is obtained.

In an embodiment, the step of transforming the spatial coordinates of the insulation defect location into the pixel coordinates according to the parameter of the image collection unit includes the steps described below.

A rotation transformation and a translation transformation are performed on the three-dimensional spatial coordinate system in which the insulation defect location is located so that a camera coordinate system is obtained.

The camera coordinate system is transformed into an image plane coordinate system based on the principle of similar triangles.

The image plane coordinate system is transformed into a pixel coordinate system according to a geometric relationship between the image plane coordinate system and the pixel coordinate system.

The two-dimensional pixel coordinates are obtained according to the pixel coordinate system and the spatial coordinates of the insulation defect location.

In an embodiment, the step of obtaining the ultrasonic intensity of the insulation defect location according to the detection result of the detection unit includes the steps described below. The temperature and the humidity of the current environment are collected.

An attenuation coefficient of an ultrasonic wave in the current environment is obtained based on the temperature and the humidity.

Signal amplitudes corresponding to different arrival moments are obtained according to the obtained arrival moments of the ultrasonic signals.

Maximum-value screening is performed on the signal amplitudes corresponding to different arrival moments so that an ultrasonic detection intensity is obtained.

The ultrasonic intensity of the insulation defect location is obtained according to the distance between the insulation defect location and the ultrasonic sensor, the ultrasonic detection intensity, and the attenuation coefficient.

In an embodiment, the step of identifying the insulation defect picture includes the steps described below.

The insulation defect location is marked in the insulation defect picture according to the two-dimensional pixel coordinates of the insulation defect location.

The distance between each ultrasonic sensor and the insulation defect location, multiple electromagnetic wave intensities, and multiple ultrasonic intensities are matched with the marked insulation defect location.

The matched distance between the ultrasonic sensor and the insulation defect location, the matched electromagnetic wave intensity, and the matched ultrasonic intensity are displayed at the insulation defect location in the insulation defect picture.

In a second aspect, the present application further provides a live detection method applied to the preceding non-contact live detection apparatus. The method includes the steps described below.

An overhead power line is detected by the detection unit of the detection apparatus, and an image of the overhead power line in a predetermined direction is collected by the image collection unit of the detection apparatus so that an insulation defect picture is obtained.

The spatial coordinates, two-dimensional pixel coordinates, electromagnetic wave intensity, and ultrasonic intensity of an insulation defect location are obtained according to a detection result of the detection unit.

The insulation defect picture is identified according to the spatial coordinates, the two-dimensional pixel coordinates, the electromagnetic wave intensity, and the ultrasonic intensity.

BRIEF DESCRIPTION OF DRAWINGS

FIG. 5 is a flowchart of obtaining the spatial coordinates and two-dimensional pixel coordinates of an insulation defect location according to an embodiment of the present application;

FIG. 6 is a flowchart of obtaining the distance between an insulation defect location and an ultrasonic sensor according to an embodiment of the present application;

FIG. 7 is a flowchart of obtaining the delay between electromagnetic signals and ultrasonic signals according to an embodiment of the present application;

FIG. 8 is a flowchart of obtaining the spatial coordinates of an insulation defect location according to an embodiment of the present application;

FIG. 9 is a schematic diagram illustrating the construction of a three-dimensional spatial coordinate system based on a detection apparatus according to an embodiment of the present application;

FIG. 12 is a schematic diagram illustrating the transformation of an image plane coordinate system into a pixel coordinate system according to an embodiment of the present application;

FIG. 13 is a flowchart of a non-contact live detection method for an insulation defect of an overhead power line for power distribution according to an embodiment of the present application.

Figure 1:
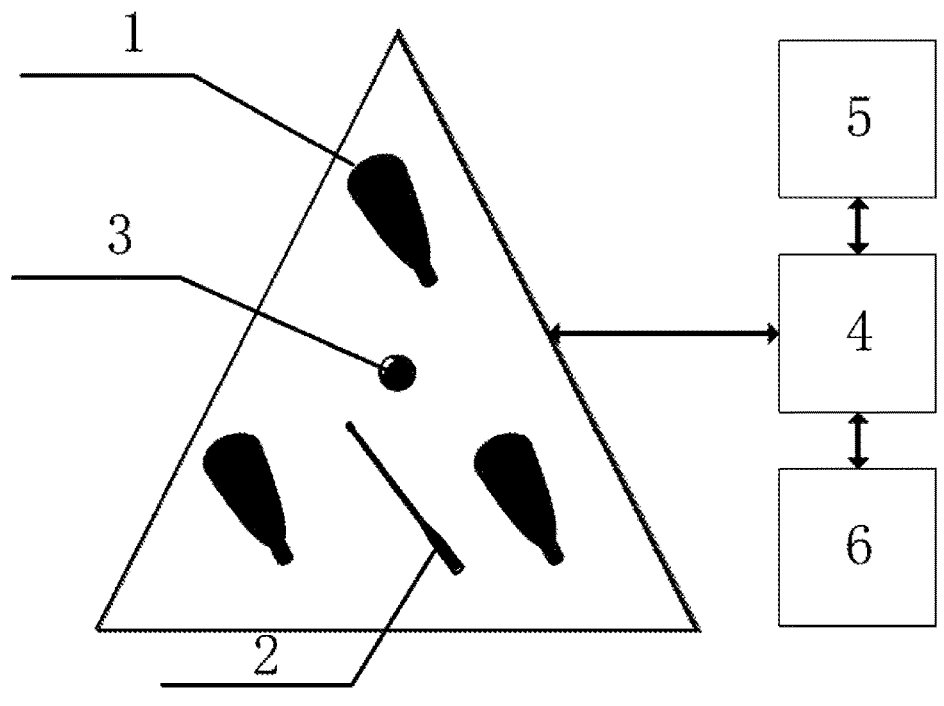
FIG. 1 is a schematic diagram of a non-contact live detection apparatus according to an embodiment of the present application.

REFERENCE LIST 1 ultrasonic sensor
2 electromagnetic wave sensor
3 image collection unit
4 processing unit 5 ultrasonic conditioning circuit 6 electromagnetic conditioning circuit

DETAILED DESCRIPTION

The preceding technical schemes are described below in conjunction with drawings and embodiments. The described embodiments are only part of the embodiments of the present application.

As shown in FIG. 1, the present application provides a non-contact live detection apparatus including a processing unit 4, a detection unit and an image collection unit 3 which are both communicatively connected to the processing unit 4. The detection unit includes an electromagnetic wave sensor 2 and at least three ultrasonic sensors 1, the image collection unit 3 is configured to collect an insulation defect picture of an overhead power line detected by the detection unit, and the processing unit 4 is configured to obtain the spatial coordinates, two-dimensional pixel coordinates, electromagnetic wave intensity, and ultrasonic intensity of an insulation defect location according to a detection result of the detection unit and identify the insulation defect picture.

The detection apparatus in the present application may include a detection base plate, the detection unit and the image collection unit 3 are fixed onto the detection base plate, the image collection unit 3 is disposed at the geometric center of all the ultrasonic sensors 1, and the collection direction of the image collection unit 3 is the same as the detection direction of the ultrasonic sensors 1. Thus, the appearance of the detection apparatus can be more beautiful, and a camera coordinate system and a spatial coordinate system can be caused to coincide with each other, facilitating the subsequent coordinate transformation and solution. The detection unit is provided with three ultrasonic sensors 1, and the three ultrasonic sensors 1 form an equilateral triangle. In an actual application scenario, an ultrasonic wave-focusing device is fixed onto the ultrasonic sensor 1, the ultrasonic wave-focusing device has the shape of a paraboloid, and the ratio of the focal length of the paraboloid to the radius of the ultrasonic sensor 1 is 1:2. Thus, a wave-focusing function and a shielding function can be better implemented so that the ultrasonic sensitivity and directionality of remote detection are improved. Considering both the wave-focusing effect and directivity of the wave-focusing device, the ultrasonic sensor 1 is placed in the plane where the focus of the paraboloid is located, and the diameter of the ultrasonic sensor 1 is set to four times the focal length. In this case, the ultrasonic sensor 1 occupies exactly the entire plane of the focus of the paraboloid. On the premise that the wave-focusing effect is not affected, the opening dimension of the wave-focusing device is reduced as much as possible so that the directivity of the wave-focusing device is enhanced.

The ultrasonic sensor 1 has a center frequency of 40 kHz, a bandwidth of 38 kHz to 42 kHz, and the sensitivity of −75 ubar so that an ultrasonic signal generated by an insulation defect is detected.

The detection apparatus in the present application may include ultrasonic conditioning circuits 5, the number of ultrasonic conditioning circuits 5 matches the number of all the ultrasonic sensors 1, and each ultrasonic conditioning circuit 5 includes a noise amplification circuit and an amplification and filter circuit connected to each other. An input terminal of the noise amplification circuit is connected to an ultrasonic sensor 1, and the noise amplification circuit is configured to perform signal amplification on a detection result of the ultrasonic sensor 1. An output terminal of the amplification and filter circuit is connected to the processing unit 4, and the amplification and filter circuit is configured to amplify and filter a signal outputted from the noise amplification circuit.

Figure 2:
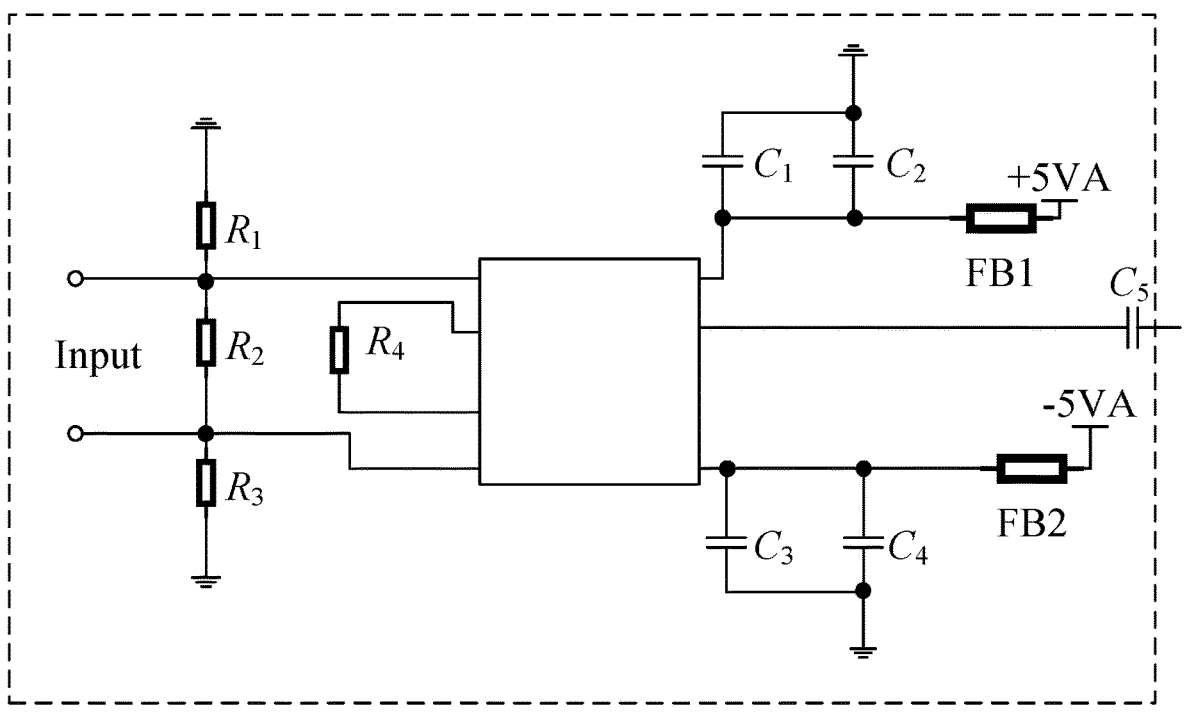
FIG. 2 is a circuit diagram of a noise amplification circuit according to an embodiment of the present application.

In a practical application scenario, as shown in FIG. 2, the noise amplification circuit includes an instrumentation amplifier, a first positive power supply circuit, and a first negative power supply circuit. A positive input pin and a negative input pin of the instrumentation amplifier are connected to the ultrasonic sensor 1, the positive input pin is connected to a first resistance and then grounded, the positive input pin and the negative input pin are connected to each other via a second resistance, and the negative input pin is connected to the third resistance and then grounded. A fourth resistance is connected between two gain-setting pins of the instrumentation amplifier. The first positive power supply circuit includes a first anti-interference device and a first grounded capacitor, two sides of the first anti-interference device are connected to a positive power supply and a positive power supply pin of the instrumentation amplifier separately, and the two sides of the first grounded capacitor are grounded and connected to the positive power supply pin of the instrumentation amplifier separately. The first negative power supply circuit includes a second anti-interference device and a second grounded capacitor, two sides of the second anti-interference device are connected to a negative power supply and a negative power supply pin of the instrumentation amplifier separately, and the two sides of the second grounded capacitor are grounded and connected to the negative power supply pin of the instrumentation amplifier separately. An output pin of the instrumentation amplifier is connected to a fifth capacitor and then to the amplification and filter circuit.

In an embodiment, the first grounded capacitor includes a first capacitor and a second capacitor which are connected in parallel, and the second grounded capacitor includes a third capacitor and a fourth capacitor which are connected in parallel.

Figure 3:
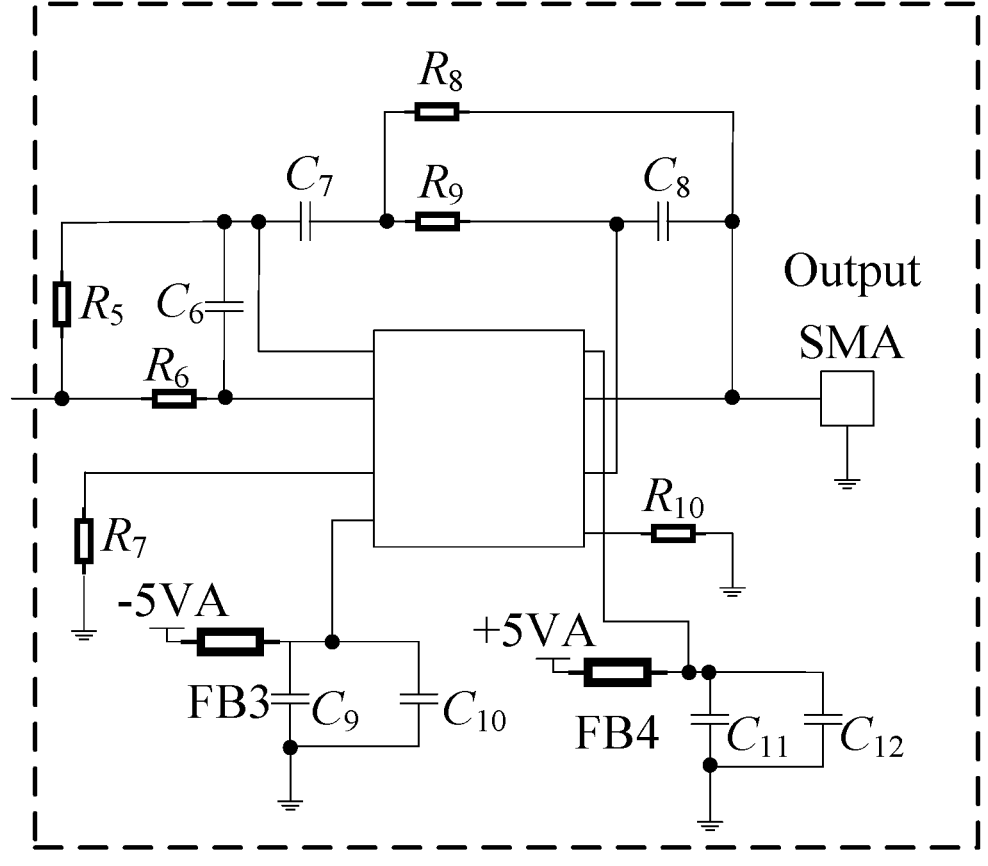
FIG. 3 is a circuit diagram of an amplification and filter circuit according to an embodiment of the present application.

In a practical application scenario, as shown in FIG. 3, the amplification and filter circuit may include an operational amplifier, a second positive power supply circuit, and a second negative power supply circuit. A first signal negative input pin of the operational amplifier is connected to the output terminal of the noise amplification circuit via a sixth resistance, a first signal positive input pin of the operational amplifier is connected to a seventh resistance and then grounded, a first output pin of the operational amplifier is connected to the first signal negative input pin via a sixth capacitor, the first output pin of the operational amplifier is connected to the output terminal of the noise amplification circuit via a fifth resistance, the first output pin of the operational amplifier is connected in series to a seventh capacitor, a ninth resistance, and an eighth capacitor sequentially and is then connected to a second output pin of the operational amplifier, the second output pin of the operational amplifier is connected between the seventh capacitor and the ninth resistance via an eighth resistance, a second signal negative input pin of the operational amplifier is connected between the ninth resistance and the eighth capacitor, a second signal positive input pin of the operational amplifier is connected to a tenth resistance and then grounded, and the second output pin of the operational amplifier is connected to the processing unit 4. The second positive power supply circuit includes a fourth anti-interference device and a third grounded capacitor, two sides of the fourth anti-interference device are connected to the positive power supply and a positive power supply pin of the operational amplifier separately, and an eleventh capacitor and a twelfth capacitor are connected in parallel and then two sides of the parallel connected capacitors are grounded and connected to the positive power supply pin of the operational amplifier separately. The second negative power supply circuit includes a third anti-interference device and a fourth grounded capacitor, two sides of the third anti-interference device are connected to the negative power supply and a negative power supply pin of the operational amplifier separately, and a ninth capacitor and a tenth capacitor are connected in parallel and then two sides of the parallel connected capacitors are grounded and connected to the negative power supply pin of the operational amplifier separately.

The third grounded capacitor includes the eleventh capacitor and the twelfth capacitor which are connected in parallel, and the fourth grounded capacitor includes the ninth capacitor and the tenth capacitor which are connected in parallel.

The noise amplification circuit is configured to perform low-noise amplification on small signals by using a low-noise instrumentation amplifier AD8429, and the gain for the amplification is about 10 times. The amplification and filter circuit is configured to amplify and filter the signal outputted from the noise amplification circuit by using a low-noise operational amplifier LT6231, where filtering refers to filtering out an acoustic interference signal other than the ultrasonic signal generated by the insulation defect, and a passband frequency is from 35 kHz to 45 kHz. A two-stage operational amplifier is integrated in the LT6231 chip, the gain of the two-stage circuit is about 100 times, and the center frequency of the two-stage circuit is about 40 kHz and the bandwidth of the two-stage circuit is about 5 kHz. The two circuits are cascaded so that the ultrasonic conditioning circuit 5 with the passband gain of about 60 dB is obtained. The passband frequency corresponding to the bandwidth of –3 dB is about 38 kHz to 42 kHz. Therefore, the low-noise amplification on the ultrasonic signal of the insulation defect can be implemented.

In the electromagnetic wave sensor 2 in the present application, an electromagnetic antenna is used. The operating frequency of the electromagnetic wave sensor 2 is from 20 MHz to 100 MHz, and the gain of the electromagnetic wave sensor 2 is 3 dBi. Therefore, an electromagnetic signal generated by the insulation defect can be detected. The detection apparatus may include an electromagnetic conditioning circuit 6, an input terminal of the electromagnetic conditioning circuit 6 is connected to the electromagnetic wave sensor 2, an output terminal of the electromagnetic conditioning circuit 6 is connected to the processing unit 4, and the electromagnetic conditioning circuit 6 is configured to filter a detection result of the electromagnetic wave sensor 2.

Figure 4:
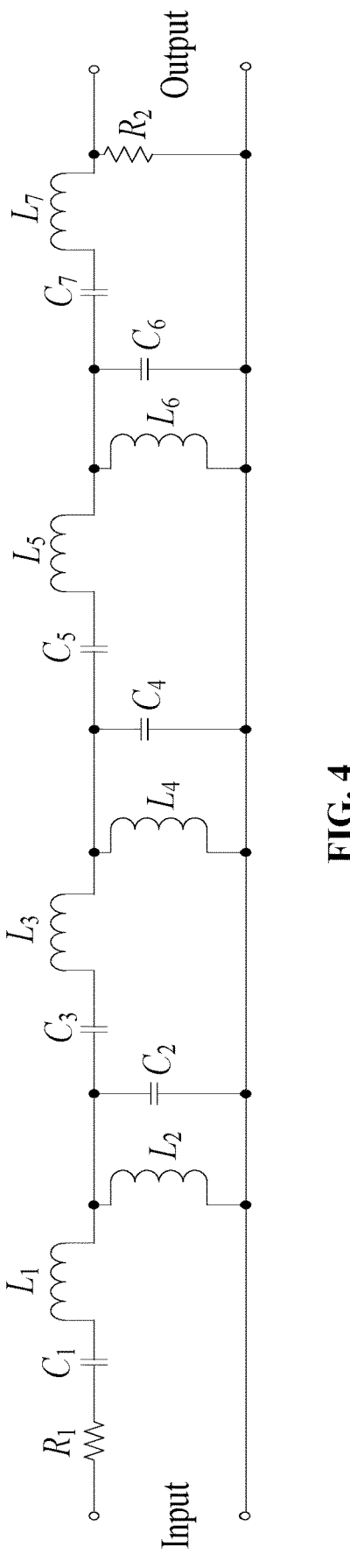
FIG. 4 is a circuit diagram of an electromagnetic conditioning circuit according to an embodiment of the present application.

In the actual application scenario, as shown in FIG. 4, the input terminal of the electromagnetic conditioning circuit 6 includes a first alternating current input terminal and a second alternating current input terminal, and the output terminal of the electromagnetic conditioning circuit 6 includes a first alternating current output terminal and a second alternating current output terminal. The first alternating current input terminal is connected to the first alternating current output terminal via a first resistance, a first capacitor, a first inductor, a third capacitor, a third inductor, a fifth capacitor, a fifth inductor, a seventh capacitor, and a seventh inductor which are sequentially connected in series, the second alternating current input terminal is connected to the second alternating current output terminal, the second alternating current input terminal is connected between the first inductor and the third capacitor via a parallel connection of a second inductor and a second capacitor, the second alternating current input terminal is connected between the third inductor and the fifth capacitor via a parallel connection of a fourth inductor and a fourth capacitor, the second alternating current input terminal is connected between the fifth inductor and the seventh capacitor via a parallel connection of a sixth inductor and a sixth capacitor, and the first alternating current output terminal is connected to the second alternating current output terminal via a second resistance.

The electromagnetic conditioning circuit 6 is designed with a seventh-order Butterworth passive band-pass filter circuit. The operating frequency corresponding to the bandwidth of –3 dB is about 25 MHz to 75 MHz, and the attenuation of broadcast and radio interference signals of common frequencies below 20 MHz or above 90 MHz can reach more than 40 dB. Therefore, the electromagnetic signal of the insulation defect can be filtered.

The detection apparatus in the present application may further include a data collection unit communicatively connected to the processing unit 4, and the data collection unit converts an ultrasonic signal of the ultrasonic sensor 1 and an electromagnetic wave signal of the electromagnetic wave sensor 2 into digital signals. Data from four channels may be sampled with 14-bit resolution in real time, and the maximum sampling rate can reach 1 G/s. The ultrasonic sensors 1 and the electromagnetic wave sensor 2 only detect signals and output the signals as analog signals. However, the processing unit 4 processes and analyzes only digital signals. Therefore, the analog signals outputted from the ultrasonic sensors 1 and the electromagnetic wave sensor 2 may be converted into digital signals by the data collection unit so that the signals can be analyzed and processed by the processing unit 4.

As shown in FIG. 5, the processing unit 4 obtains the spatial coordinates of the insulation defect location and the two-dimensional pixel coordinates of the insulation defect location according to the detection result of the detection unit, which may include the following:

A distance between the insulation defect location and each ultrasonic sensor 1 is obtained according to a detection result of the electromagnetic wave sensor 2 and detection results of all the ultrasonic sensors 1; the spatial coordinates of the insulation defect location are obtained according to the distance between the insulation defect location and each ultrasonic sensor 1 and the distance between adjacent ultrasonic sensors 1; and the spatial coordinates of the insulation defect location are transformed into the pixel coordinates according to a parameter of the image collection unit 3.

As shown in FIG. 6, the step of obtaining the distance between the insulation defect location and each ultrasonic sensor 1 according to the detection result of the electromagnetic wave sensor 2 and the detection results of the ultrasonic sensors 1 includes the following:

Electromagnetic signals detected by the electromagnetic wave sensor 2 and ultrasonic signals detected by all the ultrasonic sensors 1 are acquired; extraction is performed on the electromagnetic signals and the ultrasonic signals so that the corresponding arrival moments are obtained separately, where the arrival moments refer to the moments when the electromagnetic signals and ultrasonic signals from the insulation defect location arrive at the electromagnetic wave sensor 2 and the ultrasonic sensors 1, respectively; a delay between the electromagnetic signals and the ultrasonic signals is determined based on a discharge characteristic of the insulation defect location, the arrival moments of the electromagnetic signals, and the arrival moments of the ultrasonic signals, where the delay refers to the difference between the time when the electromagnetic signals generated by the insulation defect arrive at the electromagnetic wave sensor 2 and the time when the ultrasonic signals generated by the insulation defect arrive at the ultrasonic sensors 1; and the distance between the insulation defect location and each ultrasonic sensor 1 is obtained based on the delay between the electromagnetic signals and the ultrasonic signals.

To effectively estimate the delay between the acoustic signals and the electrical signals (the ultrasonic signals and the electromagnetic signals), the arrival moments of the ultrasonic signals and the arrival moments of the electromagnetic signals need to be extracted first. Considering that an ultrasonic detection waveform, similar to a sine oscillation wave, oscillates for a relatively long duration and is gradually increased from zero, the arrival moments of the ultrasonic signals are extracted in an energy manner. According to the energy manner, an inflection point of the energy curve of the ultrasonic signals is calculated such that an arrival moment of the ultrasonic signals is obtained. Assuming that a collected ultrasonic signal sequence is $U_{ult,n}$ and the duration is T, the average energy E0 of the ultrasonic signals may be calculated and a signal energy curve discriminant may be established. The minimal value point of the signal energy curve discriminant is calculated such that the moment corresponding to the inflection point of the energy curve of the ultrasonic signals, that is, the arrival moment of the ultrasonic signals, is obtained.

The average energy is as follows:

$$E_0 = \sum_{i=1}^{n} U_{ult,i}^2 / T.$$

The established signal energy curve discriminant is as follows:

$$P_j = \sum_{m=1}^{j} U_{ult,m}^2 - j \cdot E_0.$$

Since the discharge of the insulation defect is generated periodically and repeatedly under the action of a power frequency voltage, multiple arrival moments of the ultrasonic signals may exist. The step of performing the extraction on the ultrasonic signals to obtain the corresponding arrival moment includes the following:

The average energy of the ultrasonic signals is obtained according to the ultrasonic signals detected for the duration; the duration is divided into multiple first preset time periods; an energy curve of the ultrasonic signals is obtained according to the average energy of the ultrasonic signals and energy of ultrasonic signals within a first preset time period, and the following relationship is satisfied:

$$P_j = \sum_{m=1}^{j} U_{ult,m}^2 - j \cdot \sum_{i=1}^{n} U_{ult,i}^2 / T;$$

where $P_j$ denotes the energy curve of the ultrasonic signals in a first preset time period;

$$U_{ult,m}^2$$

denotes the energy of an $m^{th}$ ultrasonic signal within the first preset time period;

$$U_{ult,i}^2$$

denotes the energy of an $i^{th}$ ultrasonic signal for the duration; j denotes the number of ultrasonic signals detected within the first preset time period, and $j \leq n$; m denotes a serial number of an ultrasonic signal among the j ultrasonic signals, n denotes the number of ultrasonic signals detected for the duration, i denotes a serial number of an ultrasonic signal among the n ultrasonic signals, and T denotes the duration. The signals detected by the ultrasonic sensors 1 are analog signals, and the processing unit 4 can process only the digital signals during the signal analysis, therefore, the data collection apparatus converts the analog signals into the discrete digital signals, and in this case, n denotes the number of ultrasonic signals detected after the analog signals are converted into the digital signals, and the duration refers to the duration of an ultrasonic signal detected by the ultrasonic sensor 1 each time, that is, the total time of single detection by the ultrasonic sensor 1. An ultrasonic signal corresponding to the minimal value of the energy curve of the ultrasonic signals within the first preset time period is screened out according to the energy curve of the ultrasonic signals; and an arrival moment of the ultrasonic signal is obtained according to the ultrasonic signal corresponding to the minimal value of the energy curve of the ultrasonic signals.

In the present application, the minimal values in different first preset time periods are continuously calculated so that the arrival moments of the ultrasonic signals are obtained. For the determination of the minimal value, the minimum value within a first preset time period may be compared with the values of the left and right endpoints of the first preset time period. When the minimum value is less than both the values of the two endpoints, the minimum value is the minimal value, and the moment corresponding to the minimal value is the arrival moment of the ultrasonic signals. When the minimum value is greater than or equal to any one of the values of the two endpoints, no minimal value exists within this first preset time period.

Since the waveform of electromagnetic signals is similar to a pulse sequence and the energy of the signals does not increase from zero, the arrival moments of the electromagnetic signals are extracted in a threshold manner. The step of performing the extraction on the electromagnetic signals to obtain the corresponding arrival moments includes the following:

A threshold scaling coefficient with which the electromagnetic wave sensor 2 detects the electromagnetic signals is obtained according to the signal-to-noise ratio of the current detection environment, where when on-site electromagnetic interference is relatively strong, a detection threshold may be increased and the signal-to-noise ratio is increased accordingly, and if a detection threshold adjustment function is not provided, the threshold scaling coefficient is set to 5; an electromagnetic detection threshold is obtained according to the threshold scaling coefficient and the electromagnetic signals for the duration, and the following relationship is satisfied:

$$U_{thr} = k \sqrt{\dfrac{\displaystyle\sum_{i'=1}^{n'} U_{ele,i'}^2}{n'}} \; ;$$

where $U_{thr}$ denotes the electromagnetic detection threshold, k denotes the threshold scaling coefficient and ranges from 1 to 10, n' denotes the number of electromagnetic signals detected within the duration, i' denotes a serial number of an electromagnetic signal ordered according to the detection time, and $$U_{ele,i'}^2$$

denotes the energy of an $i^{th}$ electromagnetic signal. The duration is divided into multiple second preset time periods; an electromagnetic signal which reaches the electromagnetic detection threshold for the first time within a second preset time period is screened out according to the multiple second preset time periods and the electromagnetic detection threshold; and a corresponding arrival moment is determined according to the electromagnetic signal reaching the electromagnetic detection threshold for the first time.

The first preset time period and the second preset time period may have the same width or different widths, which may be selected according to actual requirements. For example, in the present application, the width of the first preset time period and the width of the second preset time period are both 5 ms.

When a discharge of the insulation defect actually occurs, a series of pulses of random time and random amplitudes are accompanied. A pulse whose arrival moment of the ultrasonic signals matches its arrival moment of the electromagnetic signals cannot be identified only according to the detection result of a single pulse. Considering the time randomness of the pulses, there is no time correlation between any two pulses in the same time sequence. However, a pulse can be found in the electromagnetic arrival moment sequence to form a fixed time difference $T_{AE}$ with each pulse in the ultrasonic arrival moment sequence. According to this statistical characteristic, a correlation accumulation factor Q(t) based on statistics is defined and used for calculating the delay $T_{AE}$ between the acoustic signals and the electrical signals.

As shown in FIG. 7, the step of determining the delay between the electromagnetic signals and the ultrasonic signals based on the discharge characteristic of the insulation defect location, the arrival moments of the electromagnetic signals, and the arrival moments of the ultrasonic signals includes the steps described below.

The correlation accumulation factor is obtained based on the arrival moments of the electromagnetic signals, the arrival moments of the ultrasonic signals, the propagation speed of the electromagnetic signals, and a preset minimum delay resolution, and the following relationship is satisfied:

$$Q(t) = \sum_{i''=1}^{a} \sum_{j''=1}^{b} \left[ \dfrac{\Delta t/v'}{\left| T_{ult,i''} - \left( T_{ele,j''} + t/v' \right) \right|} \right]_{rounding}$$

where Q(t) denotes the correlation accumulation factor, a denotes the number of arrival moments of ultrasonic signals, b denotes the number of arrival moments of electromagnetic signals, i" denotes a serial number of an ultrasonic signal ordered according to the detection time, j" denotes a serial number of an electromagnetic signal ordered according to the detection time, $\Delta t$ denotes the preset minimum delay resolution, v' denotes the propagation speed of the electromagnetic signal, $T_{ult,i''}$ denotes an $i'^{th}$ arrival moment of the ultrasonic signals, $T_{ele,j''}$ denotes a $j^{th}$ arrival moment of the electromagnetic signals, and/denotes an estimated value of the delay between the electromagnetic signals and the ultrasonic signals. The maximum value of the correlation accumulation factor is calculated so that the estimated value of the delay is obtained; multiple delay increase intervals are obtained according to the arrival moments of the electromagnetic signals, the arrival moments of the ultrasonic signals, and the preset minimum delay resolution; a delay increase interval in which the estimated value of the delay is located is determined based on the multiple delay increase intervals; the corresponding arrival moment of the electromagnetic signals and the corresponding arrival moment of the ultrasonic signals are determined according to the determined delay increase interval; and the delay between the electromagnetic signals and the ultrasonic signals is obtained according to the determined arrival moment of the electromagnetic signals and the determined arrival moment of the ultrasonic signals.

In an embodiment, the key to obtaining the delay $T_{AE}$ through the correlation accumulation factor is to increase the delay by using $\Delta t$ as a step when the correlation accumulation factor Q(t) is calculated, and the maximum value $Q_{max}$ of Q(t) may be obtained when the value of t falls within an interval of $(T_{AE}-\Delta t, T_{AE}+\Delta t)$. Therefore, the maximum value $Q_{max}$ of Q(t) may be calculated so that the delay $T_{AE}$ between the acoustic signals and the electrical signals is obtained.

As shown in FIG. 8, the step of obtaining the spatial coordinates of the insulation defect location according to the distance between the insulation defect location and each ultrasonic sensor 1 and the detection results of all the ultrasonic sensors 1 includes the following:

A delay between different ultrasonic signals is obtained based on a high-order cumulant method and the ultrasonic signals detected by all the ultrasonic sensors 1; the distance between each ultrasonic sensor 1 and the insulation defect location is obtained according to the delay between different ultrasonic signals; a three-dimensional spatial coordinate system is established, and a spatial coordinate relationship of the insulation defect location is obtained according to the distance between adjacent ultrasonic sensors 1; and the spatial coordinates of the insulation defect location are determined according to the distance between each ultrasonic sensor 1 and the insulation defect location in conjunction with the spatial coordinate relationship. As shown in FIG. 9, the establishment of the three-dimensional spatial coordinate system refers to that the optical center of a camera is used as the origin O of the three-dimensional spatial coordinate system, axes parallel to the X-axis and Y-axis of an image captured by the camera are used as the x-axis and y-axis of the three-dimensional spatial coordinate system, and the optical axis of the camera is used as the z-axis of the three-dimensional spatial coordinate system such that the three-dimensional spatial coordinate system is established.

The spatial coordinate relationship may be constructed according to the distances between all the ultrasonic sensors 1 and the corresponding coordinates of all the ultrasonic sensors 1. In the present application, three ultrasonic sensors 1 are used as an example, and the three ultrasonic sensors 1 form the equilateral triangle with a side length D. Here, the detection unit may include a first ultrasonic sensor A, a second ultrasonic sensor B, and a third ultrasonic sensor C, and the spatial coordinate relationship includes the following:

$$
\begin{cases}
\left(x - \dfrac{\sqrt{3}}{3}D\right)^2 + y^2 + z^2 = L_1^2 \\
\left(x + \dfrac{\sqrt{3}}{6}D\right)^2 + \left(y - \dfrac{D}{2}\right)^2 + z^2 = L_2^2; \\
\left(x + \dfrac{\sqrt{3}}{6}D\right)^2 + \left(y + \dfrac{D}{2}\right)^2 + z^2 = L_3^2
\end{cases}
$$

where (x, y, z) denotes the spatial coordinates of the insulation defect location, D denotes the distance between adjacent ultrasonic sensors 1, $L_1$ denotes the distance from the insulation defect location P to the first ultrasonic sensor A, $L_2$ denotes the distance from the insulation defect location P to the second ultrasonic sensor B, and $L_3$ denotes the distance from the insulation defect location P to the third ultrasonic sensor C.

In the present application, the distance between each ultrasonic sensor 1 and the insulation defect location may be obtained through the detection results of the ultrasonic sensors 1 and the detection result of the electromagnetic wave sensor 2. If the ultrasonic sensor 1 corresponding to the obtained distance is the first ultrasonic sensor, that is, $L_1$ is calculated, $L_2$ and $L_3$ also need to be calculated. If the calculation is performed through a combination of the detection results of the ultrasonic sensors 1 and the detection result of the electromagnetic wave sensor 2, a relatively large calculation error may be caused because the calculation of the signal arrival moments of different ultrasonic sensors 1 is susceptible to interference such as noise and does not fully utilize redundant information between sensors. In the present application, it is considered that signals detected by different ultrasonic sensors 1 are all generated by the discharge of the same insulation defect, the ultrasonic signals are correlated, and a correlation-based delay estimation algorithm has relatively high calculation accuracy. Therefore, in the present application, the signal delay between adjacent ultrasonic sensors 1 is calculated such that $L_2$ and $L_3$ are calculated, and the calculation may be performed by using the following equations:

$$L_2 = L_1 - T_{AB}v'; \text{ and}$$

$$L_3 = L_1 - T_{AC}v';$$

where v' denotes the acoustic velocity, $T_{AB}$ denotes a delay of signals between the first ultrasonic sensor and the second ultrasonic sensor, and $T_{AC}$ denotes a delay of signals between the first ultrasonic sensor and the third ultrasonic sensor. After $T_{AB}$ and $T_{AC}$ are calculated, $L_2$ and $L_3$ are calculated through the preceding equations. The preceding spatial coordinate relationships are simultaneously set up and solved so that the three-dimensional spatial coordinates of the insulation defect may be calculated.

Based on the similarity in delays between different ultrasonic signals, cumulant coefficients between two paths of ultrasonic signals at different shift values are calculated, and the shift value corresponding to the maximum value of the cumulant coefficients is the delay between the signals. Cumulant coefficients J(D') for different delays D' are calculated, and D' corresponding to the maximum value of J(D') is the to-be-obtained delay between the ultrasonic signals.

The step of obtaining the delay between different ultrasonic signals based on the high-order cumulant method and the ultrasonic signals detected by all the ultrasonic sensors 1 includes the following:

All the ultrasonic sensors 1 are combined in pairs to form multiple ultrasonic sensor groups; a cumulant coefficient is constructed for ultrasonic signals detected by each ultrasonic sensor group, and the following relationship is satisfied:

$$
J(D') = \frac{|c'_{4N}\{x_1(n_1 - D'),\, x_1(n_1 - D'),\, x_2(n_1),\, x_2(n_1)\}|}{\sqrt{|c'_{4N}\{x_1(n_1),\}||c'_{4N}\{x_2(n_1),\}|}};
$$

where J(D') denotes the cumulant coefficient, $c'_{4N}\{\ \}$ denotes a fourth-order cumulant function, $x_1$ denotes an ultrasonic signal detected by one ultrasonic sensor 1, $x_2$ denotes an ultrasonic signal detected by the other ultrasonic sensor 1, $n_1$ denotes the number of ultrasonic signals detected by the ultrasonic sensors 1, and D' denotes the delay between ultrasonic signals detected by the two ultrasonic sensors 1.

The maximum value of all the cumulant coefficients is calculated so that the delay between ultrasonic signals detected by two ultrasonic sensors 1 in each ultrasonic sensor group is obtained. D' corresponding to the maximum value of the cumulant coefficients is the to-be-obtained signal delay.

To improve the efficiency of on-site detection, the image collection unit 3 in the present application captures a detection picture in real time by using a high-definition lens (camera) and identifies the insulation defect location on the picture with a mark to implement the visualization positioning of the defect. Therefore, it is necessary to transform the three-dimensional spatial coordinates of the insulation defect into the two-dimensional pixel coordinates on the captured picture.

The spatial coordinate system, also referred to as a world coordinate system, is a coordinate system established using the detection apparatus as a reference datum. A pixel coordinate system is a two-dimensional coordinate system of the camera-captured picture. The coordinates of the defect obtained through the solution of the spatial location equations are the coordinates in the world coordinate system. In order to implement the camera identification of the defect in the captured picture, a coordinate transformation needs to be performed to transform the three-dimensional world coordinates to the two-dimensional pixel coordinates, and the coordinate transformation mainly includes three coordinate system transformations: the transformation from the world coordinate system to the camera coordinate system, the transformation from the camera coordinate system to an image plane coordinate system, and the transformation from the image plane coordinate system to the pixel coordinate system. The camera coordinate system is a coordinate system established using the center of the camera lens as an origin, a line perpendicular to a plane of the lens and extending outwards as a $z_e$-axis, a line extending horizontally rightwards as an $x_c$-axis, and a line extending vertically downwards as a $y_c$-axis.

In an actual application scenario, the step of transforming the spatial coordinates of the insulation defect location into the pixel coordinates according to the parameter of the image collection unit 3 includes the steps described below.

Figure 10:
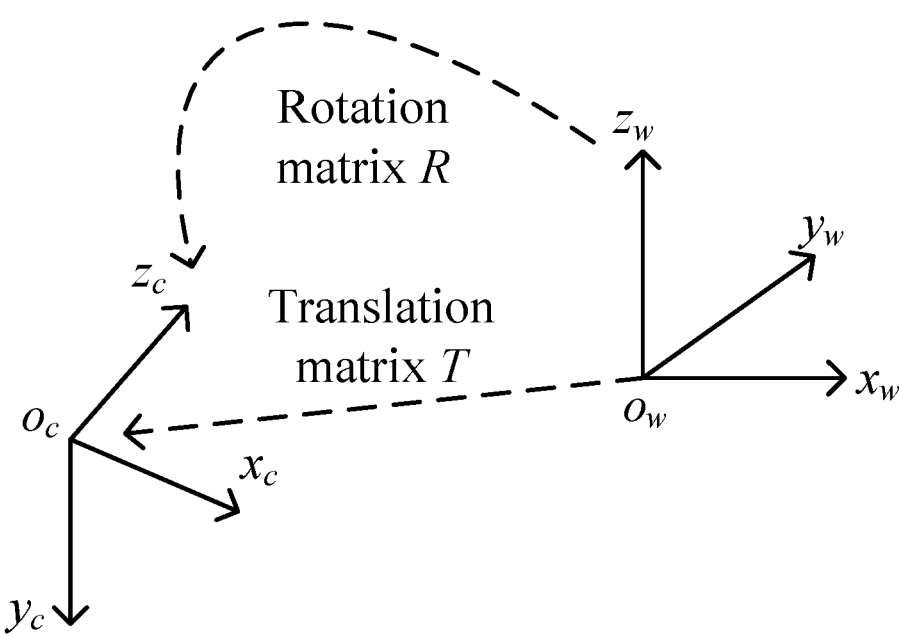
FIG. 10 is a schematic diagram illustrating the transformation of a three-dimensional spatial coordinate system into a camera coordinate system according to an embodiment of the present application.
Figure 11:
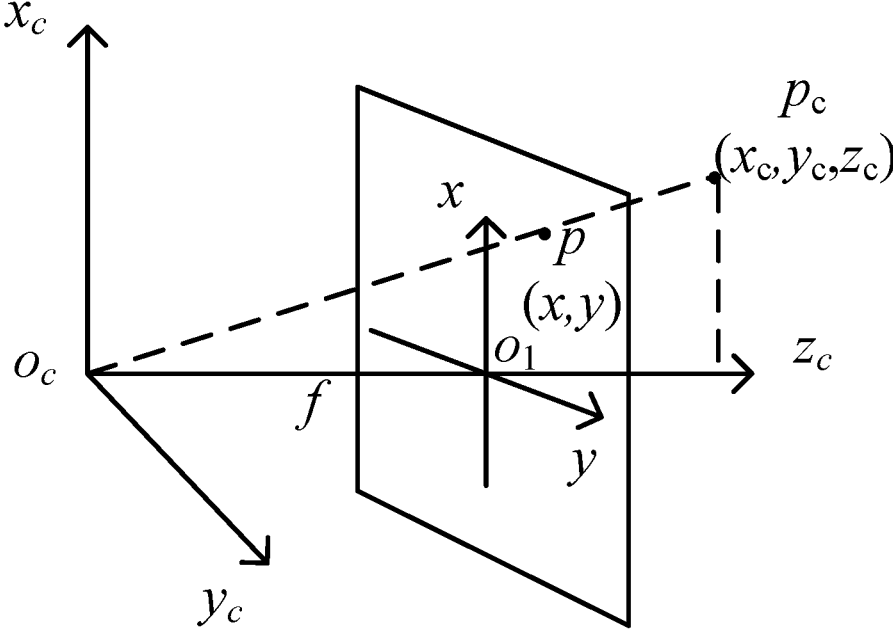
FIG. 11 is a schematic diagram illustrating the transformation of a camera coordinate system into an image plane coordinate system according to an embodiment of the present application.

As shown in FIG. 10, a rotation transformation and a translation transformation are performed on the three-dimensional spatial coordinate system in which the insulation defect location is located so that the camera coordinate system is obtained, and the following relationship is satisfied:

$$\begin{bmatrix} x_c \\ y_c \\ z_c \\ 1 \end{bmatrix} = \begin{bmatrix} R & T \\ 0 & 1 \end{bmatrix} \begin{bmatrix} x_w \\ y_w \\ z_w \\ 1 \end{bmatrix};$$

where $x_w$, $y_w$, and $z_w$ denote the three-dimensional spatial coordinate system, $x_c$, $y_c$, and $z_c$ denote the camera coordinate system, R denotes a 3×3 rotation matrix of the image collection unit 3, and T denotes a 3×1 translation matrix of the image collection unit 3. The rotation matrix and the translation matrix are used for expressing the transformation between the camera coordinate system and the world coordinate system. In the present application, the camera coordinate system coincides with the world coordinate system, and both the translation matrix T and the rotation matrix R are an identity matrix. If the camera coordinate system does not coincide with the world coordinate system, the camera coordinate system may be obtained through a mathematical transformation between coordinate systems. As shown in FIG. 11, the camera coordinate system is transformed into the image plane coordinate system based on the principle of similar triangles, and the following relationship is satisfied:

$$z_c \begin{bmatrix} x \\ y \\ 1 \end{bmatrix} = \begin{bmatrix} f & 0 & 0 & 0 \\ 0 & f & 0 & 0 \\ 0 & 0 & 1 & 0 \end{bmatrix} \begin{bmatrix} x_c \\ y_c \\ z_c \\ 1 \end{bmatrix};$$

where x and y denote the image plane coordinate system, and f denotes the focal length of the camera. The image plane coordinate system is the coordinate system of the two-dimensional imaging plane of the camera, and the distance between the origin of the camera coordinate system and the origin of the image plane coordinate system is the focal length of the camera.

As shown in FIG. 12, the image plane coordinate system is transformed into the pixel coordinate system according to the geometric relationship between the image plane coordinate system and the pixel coordinate system, and the following relationship is satisfied:

$$z_c \begin{bmatrix} u \\ v \\ 1 \end{bmatrix} = \begin{bmatrix} f_x & 0 & u_0 & 0 \\ 0 & f_y & v_0 & 0 \\ 0 & 0 & 1 & 0 \end{bmatrix} \begin{bmatrix} x_w \\ y_w \\ z_w \\ 1 \end{bmatrix};$$

where u and v denote the pixel coordinate system, $f_x$ denotes the horizontal focal length of the camera and is set to f/dx, dx denotes a physical dimension of one pixel in a u-axis direction in the pixel coordinate system, $f_y$ denotes the vertical focal length of the camera and is set to f/dy, dy denotes a physical dimension of one pixel in a v-axis direction in the pixel coordinate system, and $(u_0, v_0)$ denotes the coordinates of the origin of the image plane coordinate system in the pixel coordinate system. The two-dimensional pixel coordinates are obtained according to the pixel coordinate system and the spatial coordinates of the insulation defect location.

The step of transforming the image plane coordinate system into the pixel coordinate system according to the geometric relationship between the image plane coordinate system and the pixel coordinate system includes the following:

According to the geometric relationship between the image plane coordinate system and the pixel coordinate system, the following equations may be obtained:

$$u = \frac{x}{dx} + u_0; \text{ and}$$

$$v = \frac{y}{dy} + v_0;$$

where dx denotes a physical dimension of one pixel of a photosensitive chip in the u-axis direction, and dy denotes a physical dimension of one pixel of the photosensitive chip in the v-axis direction. The preceding equations are written in a matrix form so that the following equation may be obtained:

$$\begin{bmatrix} u \\ v \\ 1 \end{bmatrix} = \begin{bmatrix} \dfrac{1}{dx} & 0 & u_0 \\ 0 & \dfrac{1}{dy} & v_0 \\ 0 & 0 & 1 \end{bmatrix} \begin{bmatrix} x \\ y \\ 1 \end{bmatrix}.$$

The preceding equations are simultaneously set up so that the formula for the transformation from the world coordinate system to the pixel coordinate system may be obtained as follows:

$$z_c \begin{bmatrix} u \\ v \\ 1 \end{bmatrix} = \begin{bmatrix} \dfrac{1}{dx} & 0 & u_0 \\ 0 & \dfrac{1}{dy} & v_0 \\ 0 & 0 & 1 \end{bmatrix} \begin{bmatrix} f & 0 & 0 & 0 \\ 0 & f & 0 & 0 \\ 0 & 0 & 1 & 0 \end{bmatrix} \begin{bmatrix} R & T \\ 0 & 1 \end{bmatrix} \begin{bmatrix} x_w \\ y_w \\ z_w \\ 1 \end{bmatrix};$$

where $$\begin{bmatrix} \dfrac{1}{dx} & 0 & u_0 \\ 0 & \dfrac{1}{dy} & v_0 \\ 0 & 0 & 1 \end{bmatrix} \begin{bmatrix} f & 0 & 0 \\ 0 & f & 0 \\ 0 & 0 & 1 & 0 \end{bmatrix} = \begin{bmatrix} f_x & 0 & u_0 & 0 \\ 0 & f_y & v_0 & 0 \\ 0 & 0 & 1 & 0 \end{bmatrix}$$

denotes the intrinsic parameter matrix of the camera, the intrinsic parameter matrix is an intrinsic attribute of the camera and does not change after the camera leaves a factory, and the value of a parameter in the intrinsic matrix may be calibrated and calculated based on the Zhang Zhengyou calibration method; and $$\begin{bmatrix} R & T \\ 0 & 1 \end{bmatrix}$$

denotes an extrinsic parameter matrix of the camera and is composed of the translation matrix T and the rotation matrix R. The camera coordinate system and the world coordinate system of the detection apparatus in the present application coincide with each other, and each of the translation matrix T and the rotation matrix R is the identity matrix. Therefore, the pixel coordinate system may be obtained as follows:

$$z_c \begin{bmatrix} u \\ v \\ 1 \end{bmatrix} = \begin{bmatrix} f_x & 0 & u_0 & 0 \\ 0 & f_y & v_0 & 0 \\ 0 & 0 & 1 & 0 \end{bmatrix} \begin{bmatrix} x_w \\ y_w \\ z_w \\ 1 \end{bmatrix}.$$

After the coordinates $(x_w, y_w, z_w)$ of the insulation defect in the world coordinate system are obtained, the two-dimensional pixel coordinates $(u, v)$ on the camera picture may be calculated through the equations below, and after the pixel coordinates are obtained, the location of the partial discharge (the insulation defect) may be identified with a mark on the picture captured by the camera. The equations are shown as follows:

$$u = \frac{x_w f_x + z_w u_0}{z_w}; \text{ and}$$

$$v = \frac{y_w f_y + z_w v_0}{z_w}.$$

To implement the transformation of the three-dimensional spatial coordinates of the insulation defect into the two-dimensional pixel coordinates of the insulation defect, it is necessary to obtain the intrinsic parameter matrix of the camera used. A Sony IMX415 auto-focus distortionless camera is used in the detection apparatus of the present application and supports high-definition capturing of maximum 8 megapixels. Since the display screen of the detection apparatus has a limited size, an excessively high resolution cannot have a better display effect. Therefore, a resolution of 640×480 is used for capturing and displaying the detection picture so that the burden of processing large-pixel data is reduced.

The intrinsic attribute of the camera is described by the intrinsic parameter matrix of the camera, and the intrinsic parameter matrix of the camera is not affected by the external environment. After the camera leaves the factory, the intrinsic parameter matrix of the camera does not change, for example, the dimension of a picture element and the distance between a target object and the optical center. The intrinsic parameter matrix of the camera may be obtained through camera calibration. The Zhang Zhengyou calibration method as the most common camera calibration method has a low requirement for the precision of a calibration object, and the method includes that multiple images of different angles are captured using a planar checkerboard, and then the calibration parameter of the camera may be determined through a corresponding algorithm. In the present application, the parameter of the camera is calibrated using the Zhang Zhengyou calibration method, and the intrinsic parameter matrix of the camera is calculated. Thus, the coordinates of the insulation defect in the world coordinate system are transformed into the two-dimensional pixel coordinate system so that it is convenient to perform the visualization identification on the insulation defect in the picture displayed by the camera.

The calibration process of the Zhang Zhengyou calibration method is based on the feature points of the planar checkerboard. The position of the camera relative to the planar checkerboard is adjusted such that 10 to 20 groups of images of different angles and distances are captured, and the calibration parameter of the camera is solved with matrix decomposition and the maximum likelihood method. OpenCV is a cross-platform computer vision and machine learning software library. OpenCV is lightweight and efficient and is formed by a series of C functions and a small number of C++ classes. OpenCV implements many universal algorithms in the aspects of image processing and computer vision. In an actual camera calibration process, after 10 to 20 camera calibration pictures are captured, the Zhang Zhengyou camera calibration function library in OpenCV is used for performing the camera calibration. For the camera of the detection apparatus in the present application, the camera calibration is performed many times with OpenCV and an average value is obtained so that multiple parameters of the intrinsic parameter matrix of the used camera under the resolution of 640×480 are separately obtained as follows: $f_x=1483$, $f_y=1488$, $u_0=337$, and $v_0=245$.

The step of obtaining the ultrasonic intensity of the insulation defect location according to the detection result of the detection unit includes the following:

The temperature of the current environment and the humidity of the current environment are collected; an attenuation coefficient of an ultrasonic wave in the current environment is obtained based on the temperature and the humidity; signal amplitudes corresponding to different arrival moments are obtained according to the obtained arrival moments of the ultrasonic signals; maximum-value screening is performed on the signal amplitudes corresponding to different arrival moments so that an ultrasonic detection intensity is obtained; the ultrasonic intensity of the insulation defect location is obtained according to the distance between the insulation defect location and the ultrasonic sensor 1, the ultrasonic detection intensity, and the attenuation coefficient, and the following relationship is satisfied:

$$V_0 = 20 lg \left( \frac{x' e^{\alpha x'} U'_x}{l m V} \right);$$

where $V_0$ denotes the ultrasonic intensity of the insulation defect location, x' denotes the distance between the insulation defect location and the ultrasonic sensor 1, $\alpha$ denotes the attenuation coefficient, $U_{x'}$ denotes the ultrasonic detection intensity, and V denotes the acoustic velocity. 20 is a unique value in the standard mathematical formula when the discharge intensity is expressed in a decibel (dB) value.

In the present application, for obtaining the attenuation coefficient of the ultrasonic wave in the current environment, a simulation study is performed on the propagation characteristic of the ultrasonic wave through COMSOL finite element analysis software. In addition, MATLAB is used for data fitting. Thus, the attenuation coefficients $\alpha$ of the ultrasonic wave in different environments (different temperatures and different humidity) are indirectly calculated. An inversion method is provided, with which ultrasonic detection intensities at different distances are converted through inversion to the discharge source (the insulation defect location), thereby reducing the difference caused by different detection distances in the evaluation of the discharge intensity of the insulation defect. The ultrasonic wave generated by the discharge of the insulation defect is generated by the vibration of a point source and is detected at a far distance, so the ultrasonic wave may be regarded as a spherical wave. In a propagation process, the spherical wave is subjected to both medium attenuation and diffusion attenuation. The acoustic pressure attenuation may be calculated by the following equation:

$$P'_x = P_0 \frac{e^{-ax'}}{x'};$$

where $P_{x'}$ denotes an acoustic pressure of a detection location at a distance x' from the wave source, $P_0$ denotes an initial acoustic pressure at which the acoustic wave contacts a medium, and $\alpha$ denotes the attenuation coefficient of the medium.

After the attenuation coefficient $\alpha$ of the medium is determined, the propagation characteristic of the ultrasonic wave may be obtained. However, the attenuation coefficient $\alpha$ is related to factors of the medium under a specific temperature and humidity, such as the acoustic velocity, viscosity, density, specific heat capacity, a thermal conductivity coefficient, and a particle dimension, on which no study has performed a complete theoretical analysis. Therefore, in the present application, the simulation study is performed on the propagation characteristic of the ultrasonic wave through COMSOL finite element analysis software. In addition, MATLAB is used for the data fitting. Thus, the attenuation coefficients $\alpha$ of the ultrasonic wave in different environments (different temperatures and different humidity) are indirectly calculated. Finally, the dB value $V_0$ of the ultrasonic detection intensity at the discharge source is calculated with the following ultrasonic detection intensity inversion formula:

$$V_0 = 20lg\left(\frac{x' e^{ax'} U'_x}{1mV}\right).$$

After the ultrasonic detection voltage $U_{x'}$ at the location with the distance x' is obtained and the detection distance x' and the ultrasonic attenuation coefficient $\alpha$ are determined, the ultrasonic detection intensity $V_0$ at the sound source may be calculated. The ultrasonic detection intensities at different detection distances are all inverted to the sound source so that the difference caused by the different detection distances is reduced and a unified reference basis is provided for the evaluation of the discharge intensity of the insulation defect.

In an application scenario, the environmental factors affecting the propagation characteristic of the ultrasonic wave are mainly the temperature and the humidity. In addition, different frequencies of the ultrasonic wave may also affect the propagation characteristic. Since both the ultrasonic sensor 1 and the conditioning circuit used in the detection apparatus of the present application have the center frequency of 40 kHz, the frequency of simulated ultrasonic signals is set to 40 kHz. Since the temperature and humidity of the actual environment vary greatly, the simulation study is performed on the propagation characteristic of the ultrasonic wave under different temperature and humidity combinations, and the corresponding attenuation coefficient $\alpha$ is calculated through the preceding equation.

Since a distance range for detecting the defect of an overhead power line for power distribution is generally about 6 m to 12 m, a sphere with a radius of 15 m is established as a geometric simulation model, and a transient study is performed with a ray acoustics module. The simulation time range is set to 0 ms to 40 ms, the time step is set to 0.01 ms, the acoustic fluid model is set as atmospheric attenuation, ultrasonic signals are released from the point sound source having the frequency of 40 kHz and are radiated in a form of the spherical wave, and the power of the sound source is set to 1 W. The model can be accurately solved through the conventional meshing of simulation software. The medium of the simulation model is set as the air domain, the boundary condition is set as passing through, that is, no reflection occurs, and variations of the acoustic pressure of the ultrasonic wave at different propagation distances are studied.

The propagation distance of the ultrasonic wave is set to 0 m to 12 m, the interval is set to 1 m, and the temperature and the humidity are set so that the variations of the acoustic pressure of the ultrasonic wave at different propagation distances may be obtained. For example, the temperature is 25° C., and the relative humidity is 60%. Curve fitting toolbox cftool of MATLAB is used for fitting acoustic pressure data obtained through the simulation, the following equation is used as a fitting function:

$$f(x) = a\frac{e^{-bx}}{x}$$

the preceding is an acoustic pressure attenuation formula in line with the propagation of the spherical wave, and the obtained attenuation coefficient $\alpha$ is about 0.15. The fitting results are shown in Table 1 below.

TABLE 1

| Fitting results at different temperatures and different relative humidity | | | | | | | | | |
|---|---|---|---|---|---|---|---|---|---|
| Attenuation | | Temperature/° C. | | | | | | | |
| coefficient α | | 5 | 10 | 15 | 20 | 25 | 30 | 35 | 40 |
| Relative humidity/ % | 30 | 0.048 | 0.065 | 0.090 | 0.12 | 0.16 | 0.18 | 0.19 | 0.18 |
| | 40 | 0.058 | 0.081 | 0.11 | 0.14 | 0.17 | 0.17 | 0.16 | 0.15 |
| | 50 | 0.069 | 0.096 | 0.13 | 0.15 | 0.16 | 0.16 | 0.14 | 0.13 |
| | 60 | 0.079 | 0.11 | 0.14 | 0.15 | 0.15 | 0.14 | 0.13 | 0.12 |
| | 70 | 0.088 | 0.12 | 0.14 | 0.15 | 0.14 | 0.13 | 0.12 | 0.10 |
| | 80 | 0.096 | 0.12 | 0.14 | 0.14 | 0.13 | 0.12 | 0.11 | 0.096 |

In the present application, after the detection of the insulation defect is completed, it is also necessary to identify the insulation defect in the insulation defect picture to implement the visualization. The step of performing the identification on the insulation defect picture may include the following:

The insulation defect location is marked in the insulation defect picture according to the two-dimensional pixel coordinates of the insulation defect location; the distance between each ultrasonic sensor 1 and the insulation defect location, multiple electromagnetic wave intensities, and multiple ultrasonic intensities are matched with the marked insulation defect location; a matched distance between an ultrasonic sensor 1 and the insulation defect location, a matched electromagnetic wave intensity, and a matched ultrasonic intensity are displayed at the insulation defect location in the insulation defect picture.

As shown in FIG. 13, the present application further provides a live detection method in which the preceding non-contact live detection apparatus is used. The method includes the following:

An overhead power line is detected by a detection unit, and an image of the overhead power line in a predetermined direction is collected by an image collection unit so that an insulation defect picture is obtained; the spatial coordinates, two-dimensional pixel coordinates, electromagnetic wave intensity, and ultrasonic intensity of an insulation defect location are obtained according to a detection result of the detection unit; and identification is performed on the insulation defect picture according to the spatial coordinates, the two-dimensional pixel coordinates, the electromagnetic wave intensity, and the ultrasonic intensity.

In an actual on-site inspection, the non-contact live detection apparatus faces an insulator of the overhead power line. If a defect exists, an abnormal signal can be detected. If no abnormal signal can be detected, the insulator is normal and has no defect.

Figure 14:
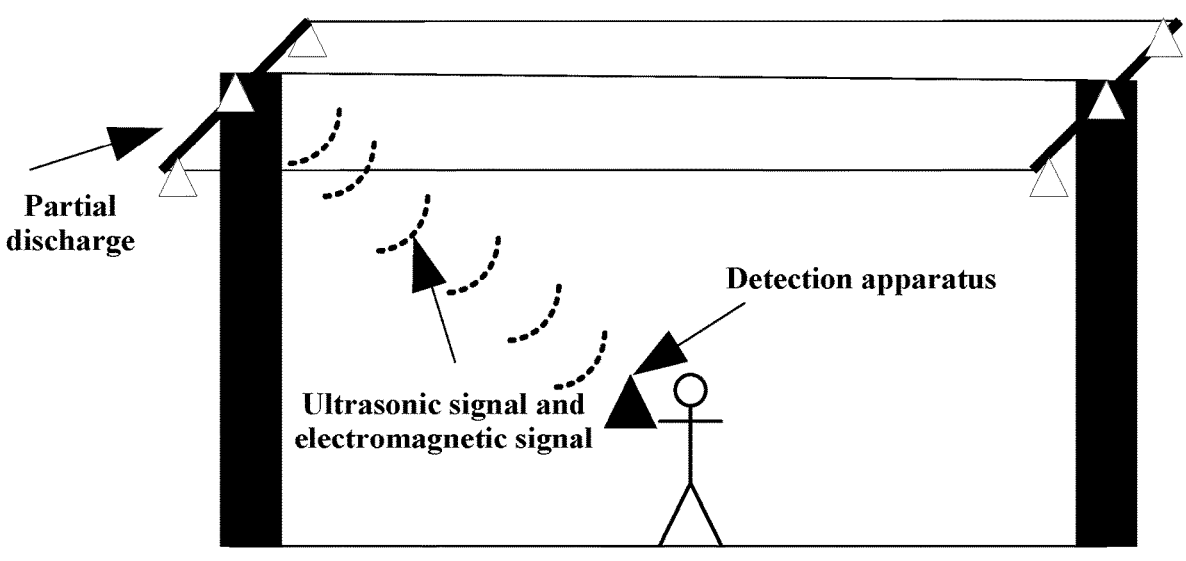
FIG. 14 is a schematic diagram illustrating an application of a non-contact live detection apparatus according to an embodiment of the present application.

In an actual application, as shown in FIG. 14, the overhead power line for power distribution does not need to be de-energized, and an operator uses the detection apparatus on the ground to implement remote non-contact detection and positioning on an insulation defect of the insulator of the overhead power line for power distribution and an insulation defect of a cable switching terminal.

The non-contact live detection apparatus and the live detection method provided by the present application include at least the effects below.

(1) The detection unit and the processing unit 4 are provided so that the two-dimensional pixel coordinates, the electromagnetic wave intensity, and the ultrasonic intensity of the insulation defect location may be obtained according to the detection result. The image collection unit 3, the detection unit, and the processing unit 4 cooperate with each other so that the visualization identification may be performed on the insulation defect picture according to the obtained two-dimensional pixel coordinates, electromagnetic wave intensity, and ultrasonic intensity of the insulation defect location.

(2) In the present application, the insulation defect is positioned based on the acoustic-electrical combination method and the TDOA algorithm, a three-dimensional spatial positioning problem is converted into a two-dimensional positioning problem, and the positioning accuracy of the insulation defect is improved.

(3) In the present application, the ultrasonic wave-focusing device and the high-gain ultrasonic signal conditioning circuit 5 are designed to pre-amplify the ultrasonic signal generated by the insulation defect so that the ultrasonic sensitivity of remote detection is improved, and the suitable shape and dimension of the wave-focusing device are designed so that the capability of the detection apparatus to resist external interference is enhanced.

(4) The ultrasonic conditioning circuit 5 and the electromagnetic conditioning circuit 6 process the discharge signal of the insulation defect detected by the ultrasonic sensors 1 and the discharge signal of the insulation defect detected by the electromagnetic sensor 2, respectively. An interference signal may exist in an actual detection process and affect a detection effect. Therefore, the ultrasonic conditioning circuit 5 and the electromagnetic conditioning circuit 6 in the present application filter the discharge signal of the insulation defect to filter out the interference signal and keep an effective abnormal discharge signal. Further, since the ultrasonic signal is subjected to relatively large attenuation when being propagated through air, the ultrasonic conditioning circuit 5 can filter and amplify the ultrasonic signal at the same time. However, since the electromagnetic signal is subjected to relatively small attenuation, the electromagnetic conditioning circuit 6 filters the electromagnetic signal.

(5) In the present application, the inversion method of the ultrasonic detection intensity is provided, and the ultrasonic detection intensities at different distances are all inversely converted to the sound source so that the difference between different detection distances in the evaluation of the discharge intensity of the insulation defect is reduced.

What is claimed is:

1. A non-contact detection apparatus for detecting an insulation defect of overhead power lines for power distribution, comprising a processing unit, a detection unit and an image collection unit, the detection unit and the image collection unit communicatively connected to the processing unit;

wherein the detection unit comprises an electromagnetic wave sensor and at least three ultrasonic sensors;

the image collection unit is configured to collect an insulation defect picture of an overhead power line detected by the detection unit; and the processing unit is configured to obtain spatial coordinates of an insulation defect location, two-dimensional pixel coordinates of the insulation defect location, an electromagnetic wave intensity of the insulation defect location, and an ultrasonic intensity of the insulation defect location according to a detection result of the detection unit, and perform identification on the insulation defect picture;

wherein the processing unit is configured to obtain the spatial coordinates of the insulation defect location and the two-dimensional pixel coordinates of the insulation defect location according to the detection result of the detection unit in the following manner:

obtaining a distance between the insulation defect location and each of the at least three ultrasonic sensors according to a detection result of the electromagnetic wave sensor and detection results of the at least three ultrasonic sensors;

obtaining the spatial coordinates of the insulation defect location according to the distance between the insulation defect location and each of the at least three ultrasonic sensors and a distance between adjacent ultrasonic sensors of the at least three ultrasonic sensors; and transforming the spatial coordinates of the insulation defect location into the pixel coordinates according to a parameter of the image collection unit;

wherein the processing unit is configured to obtain the distance between the insulation defect location and each of the at least three ultrasonic sensors according to the detection result of the electromagnetic wave sensor and the detection results of the at least three ultrasonic sensors in the following manner:

acquiring electromagnetic signals detected by the electromagnetic wave sensor and ultrasonic signals detected by the at least three ultrasonic sensors;

performing extraction on the electromagnetic signals and the ultrasonic signals to obtain corresponding arrival moments of the electromagnetic signals and corresponding arrival moments of the ultrasonic signals, separately;

determining a delay between the electromagnetic signals and the ultrasonic signals based on a discharge characteristic of the insulation defect location, the arrival moments of the electromagnetic signals and the arrival moments of the ultrasonic signals; and obtaining the distance between the insulation defect location and each of the at least three ultrasonic sensors based on the delay between the electromagnetic signals and the ultrasonic signals;

wherein the processing unit is configured to determine the delay between the electromagnetic signals and the ultrasonic signals based on the discharge characteristic of the insulation defect location, the arrival moments of the electromagnetic signals and the arrival moments of the ultrasonic signals in the following manner:

obtaining a plurality of delay increase intervals according to the arrival moments of the electromagnetic signals, the arrival moments of the ultrasonic signals, and a preset minimum delay resolution;

determining, based on the plurality of delay increase intervals, a delay increase interval in which an estimated value of the delay is located;

determining a corresponding arrival moment of the electromagnetic signals and a corresponding arrival moment of the ultrasonic signals according to the determined delay increase interval; and obtaining the delay between the electromagnetic signals and the ultrasonic signals according to the determined arrival moment of the electromagnetic signals and the determined arrival moment of the ultrasonic signals.

2. The detection apparatus according to claim 1, further comprising ultrasonic conditioning circuits, wherein a number of the ultrasonic conditioning circuits matches a number of the at least three ultrasonic sensors, and each of the ultrasonic conditioning circuits comprises a noise amplification circuit and an amplification and filter circuit which are connected to each other;

wherein an input terminal of the noise amplification circuit is connected to an ultrasonic sensor among the at least three ultrasonic sensors, the noise amplification circuit is configured to perform signal amplification on a detection result of the ultrasonic sensor, an output terminal of the amplification and filter circuit is connected to the processing unit, and the amplification and filter circuit is configured to amplify and filter a signal outputted from the noise amplification circuit.

3. The detection apparatus according to claim 2, further comprising an electromagnetic conditioning circuit, wherein an input terminal of the electromagnetic conditioning circuit is connected to the electromagnetic wave sensor, an output terminal of the electromagnetic conditioning circuit is connected to the processing unit, and the electromagnetic conditioning circuit is configured to filter a detection result of the electromagnetic wave sensor.

4. The detection apparatus according to claim 1, further comprising an electromagnetic conditioning circuit, wherein an input terminal of the electromagnetic conditioning circuit is connected to the electromagnetic wave sensor, an output terminal of the electromagnetic conditioning circuit is connected to the processing unit, and the electromagnetic conditioning circuit is configured to filter a detection result of the electromagnetic wave sensor.

5. The detection apparatus according to claim 1, wherein the processing unit is configured to perform the identification on the insulation defect picture in the following manner:

marking the insulation defect location in the insulation defect picture according to the two-dimensional pixel coordinates of the insulation defect location;

matching a distance between each of the at least three ultrasonic sensors and the insulation defect location, a plurality of electromagnetic wave intensities, and a plurality of ultrasonic intensities with the marked insulation defect location; and displaying a matched distance between an ultrasonic sensor of the at least three ultrasonic sensors and the insulation defect location, a matched electromagnetic wave intensity, and a matched ultrasonic intensity at the insulation defect location in the insulation defect picture.

6. The detection apparatus according to claim 1, wherein the processing unit is configured to perform the extraction on the ultrasonic signals to obtain the corresponding arrival moments of the ultrasonic signals in the following manner:

obtaining average energy of the ultrasonic signals according to the ultrasonic signals detected for a duration;

dividing the duration into a plurality of first preset time periods;

obtaining an energy curve of the ultrasonic signals according to the average energy of the ultrasonic signals and energy of ultrasonic signals within a first preset time period among the plurality of first preset time periods;

screening out, according to the energy curve of the ultrasonic signals, an ultrasonic signal corresponding to a minimal value of the energy curve of the ultrasonic signals within the first preset time period; and obtaining an arrival moment of the ultrasonic signal according to the ultrasonic signal corresponding to the minimal value of the energy curve of the ultrasonic signals; and wherein the processing unit is configured to perform the extraction on the electromagnetic signals to obtain the corresponding arrival moments of the electromagnetic signals in the following manner:

obtaining, according to a signal-to-noise ratio of a current detection environment, a threshold scaling coefficient with which the electromagnetic wave sensor detects the electromagnetic signals;

obtaining an electromagnetic detection threshold according to the threshold scaling coefficient and the electromagnetic signals within the duration;

dividing the duration into a plurality of second preset time periods;

screening out, according to the plurality of second preset time periods and the electromagnetic detection threshold, an electromagnetic signal which reaches the electromagnetic detection threshold for a first time within a second preset time period among the plurality of second preset time periods; and determining a corresponding arrival moment of the electromagnetic signal according to the electromagnetic signal reaching the electromagnetic detection threshold for the first time.

7. The detection apparatus according to claim 6, wherein the processing unit is configured to determine the delay between the electromagnetic signals and the ultrasonic signals based on the discharge characteristic of the insulation defect location, the arrival moments of the electromagnetic signals and the arrival moments of the ultrasonic signals in the following manner:

obtaining a correlation accumulation factor based on the arrival moments of the electromagnetic signals, the arrival moments of the ultrasonic signals, a propagation speed of the electromagnetic signals, and the preset minimum delay resolution, wherein the following relationship is satisfied:

$$Q(t) = \sum_{i''=1}^{a} \sum_{j''=1}^{b} \left[ \frac{\Delta t / v'}{\left| T''_{ult,i} - \left( T''_{ele,j} + t / v' \right) \right|} \right]_{rounding}$$

wherein Q(t) denotes the correlation accumulation factor, a denotes a number of the arrival moments of the ultrasonic signals, b denotes a number of the arrival moments of the electromagnetic signals, i" denotes a serial number of an ultrasonic signal ordered according to detection time, j" denotes a serial number of an electromagnetic signal ordered according to the detection time, $\Delta t$ denotes the preset minimum delay resolution, v' denotes the propagation speed of the electromagnetic signals, $T_{ult,i''}$ denotes an $i''^{th}$ arrival moment of the ultrasonic signals, $T_{ele,j''}$ denotes a $j''^{th}$ arrival moment of the electromagnetic signals, and t denotes the estimated value of the delay between the electromagnetic signals and the ultrasonic signals;
    calculating a maximum value of the correlation accumulation factor to obtain the estimated value of the delay.
    8. The detection apparatus according to claim 6, wherein the processing unit is configured to obtain the ultrasonic intensity of the insulation defect location according to the detection result of the detection unit in the following manner:
    collecting a temperature of a current environment and a humidity of the current environment;
    obtaining an attenuation coefficient of an ultrasonic wave in the current environment based on the temperature and the humidity;
    obtaining, according to the obtained arrival moments of the ultrasonic signals, signal amplitudes corresponding to different arrival moments;
    performing maximum-value screening on the signal amplitudes corresponding to different arrival moments to obtain an ultrasonic detection intensity; and
    obtaining the ultrasonic intensity of the insulation defect location according to the distance between the insulation defect location and each of the at least three ultrasonic sensors, the ultrasonic detection intensity, and the attenuation coefficient.
    9. The detection apparatus according to claim 1, wherein the processing unit is configured to determine the delay between the electromagnetic signals and the ultrasonic signals based on the discharge characteristic of the insulation defect location, the arrival moments of the electromagnetic signals and the arrival moments of the ultrasonic signals in the following manner:
    obtaining a correlation accumulation factor based on the arrival moments of the electromagnetic signals, the arrival moments of the ultrasonic signals, a propagation speed of the electromagnetic signals, and the preset minimum delay resolution, wherein the following relationship is satisfied:

$$Q(t) = \sum_{i''=1}^{a} \sum_{j''=1}^{b} \left[ \frac{\Delta t / v'}{\left| T''_{ult,i} - \left( T''_{ele,j} + t / v' \right) \right|} \right]_{rounding}$$

wherein Q(t) denotes the correlation accumulation factor, a denotes a number of the arrival moments of the ultrasonic signals, b denotes a number of the arrival moments of the electromagnetic signals, i" denotes a serial number of an ultrasonic signal ordered according to detection time, j" denotes a serial number of an electromagnetic signal ordered according to the detection time, $\Delta t$ denotes the preset minimum delay resolution, v' denotes the propagation speed of the electromagnetic signals, $T_{ult,i''}$ denotes an $i''^{th}$ arrival moment of the ultrasonic signals, $T_{ele,j''}$ denotes a $j''^{th}$ arrival moment of the electromagnetic signals, and t denotes the estimated value of the delay between the electromagnetic signals and the ultrasonic signals;
    calculating a maximum value of the correlation accumulation factor to obtain the estimated value of the delay.
    10. The detection apparatus according to claim 1, wherein the processing unit is configured to obtain the ultrasonic intensity of the insulation defect location according to the detection result of the detection unit in the following manner:
    collecting a temperature of a current environment and a humidity of the current environment;
    obtaining an attenuation coefficient of an ultrasonic wave in the current environment based on the temperature and the humidity;
    obtaining, according to the obtained arrival moments of the ultrasonic signals, signal amplitudes corresponding to different arrival moments;
    performing maximum-value screening on the signal amplitudes corresponding to different arrival moments to obtain an ultrasonic detection intensity; and
    obtaining the ultrasonic intensity of the insulation defect location according to the distance between the insulation defect location and each of the at least three ultrasonic sensors, the ultrasonic detection intensity, and the attenuation coefficient.
    11. The detection apparatus according to claim 1, wherein the processing unit is configured to obtain the spatial coordinates of the insulation defect location according to the distance between the insulation defect location and each of the at least three ultrasonic sensors and a distance between adjacent ultrasonic sensors of the at least three ultrasonic sensors in the following manner:
    obtaining a delay between different ultrasonic signals based on a high-order cumulant method and the ultrasonic signals detected by the at least three ultrasonic sensors;
    obtaining the distance between the each of the at least three ultrasonic sensors and the insulation defect location according to the delay between different ultrasonic signals;
    establishing a three-dimensional spatial coordinate system, and obtaining a spatial coordinate relationship of the insulation defect location according to the distance between adjacent ultrasonic sensors; and
    determining the spatial coordinates of the insulation defect location according to the distance between the each of the at least three ultrasonic sensors and the insulation defect location in conjunction with the spatial coordinate relationship.
    12. The detection apparatus according to claim 11, wherein the processing unit is configured to obtain the delay between different ultrasonic signals based on the high-order cumulant method and the ultrasonic signals detected by the at least three ultrasonic sensors in the following manner:
    combining the at least three ultrasonic sensors in pairs to form a plurality of ultrasonic sensor groups;

constructing a cumulant coefficient for ultrasonic signals detected by each of plurality of ultrasonic sensor groups;

calculating a maximum value of all cumulant coefficients to obtain the delay between ultrasonic signals detected by two ultrasonic sensors in the each of plurality of ultrasonic sensor groups.

13. A detection method, being applied to a non-contact detection apparatus for an insulation defect of overhead power lines for power distribution, wherein the non-contact detection apparatus comprises a processing unit, a detection unit and an image collection unit, the detection unit and the image collection unit communicatively connected to the processing unit; wherein the detection unit comprises an electromagnetic wave sensor and at least three ultrasonic sensors; the image collection unit is configured to collect an insulation defect picture of an overhead power line detected by the detection unit; and the processing unit is configured to obtain spatial coordinates of an insulation defect location, two-dimensional pixel coordinates of the insulation defect location, an electromagnetic wave intensity of the insulation defect location, and an ultrasonic intensity of the insulation defect location according to a detection result of the detection unit, and perform identification on the insulation defect picture;

wherein the detection method comprises:

detecting, by the detection unit of the detection apparatus, an overhead power line, and collecting, by the image collection unit of the detection apparatus, an image of the overhead power line in a predetermined direction to obtain the insulation defect picture;

obtaining spatial coordinates of an insulation defect location, two-dimensional pixel coordinates of the insulation defect location, an electromagnetic wave intensity of the insulation defect location, and an ultrasonic intensity of the insulation defect location according to a detection result of the detection unit; and performing identification on the insulation defect picture according to the spatial coordinates, the two-dimensional pixel coordinates, the electromagnetic wave intensity, and the ultrasonic intensity;

wherein obtaining the spatial coordinates of the insulation defect location and the two-dimensional pixel coordinates of the insulation defect location according to the detection result of the detection unit comprises:

obtaining a distance between the insulation defect location and each of the at least three ultrasonic sensors according to a detection result of the electromagnetic wave sensor and detection results of the at least three ultrasonic sensors;

obtaining the spatial coordinates of the insulation defect location according to the distance between the insulation defect location and each of the at least three ultrasonic sensors and a distance between adjacent ultrasonic sensors of the at least three ultrasonic sensors; and transforming the spatial coordinates of the insulation defect location into the pixel coordinates according to a parameter of the image collection unit;

wherein obtaining the distance between the insulation defect location and each of the at least three ultrasonic sensors according to the detection result of the electromagnetic wave sensor and the detection results of the at least three ultrasonic sensors comprises:

acquiring electromagnetic signals detected by the electromagnetic wave sensor and ultrasonic signals detected by the at least three ultrasonic sensors;

performing extraction on the electromagnetic signals and the ultrasonic signals to obtain corresponding arrival moments of the electromagnetic signals and corresponding arrival moments of the ultrasonic signals, separately;

determining a delay between the electromagnetic signals and the ultrasonic signals based on a discharge characteristic of the insulation defect location, the arrival moments of the electromagnetic signals and the arrival moments of the ultrasonic signals; and obtaining the distance between the insulation defect location and each of the at least three ultrasonic sensors based on the delay between the electromagnetic signals and the ultrasonic signals;

wherein determining the delay between the electromagnetic signals and the ultrasonic signals based on the discharge characteristic of the insulation defect location, the arrival moments of the electromagnetic signals and the arrival moments of the ultrasonic signals comprises:

obtaining a plurality of delay increase intervals according to the arrival moments of the electromagnetic signals, the arrival moments of the ultrasonic signals, and a preset minimum delay resolution;

determining, based on the plurality of delay increase intervals, a delay increase interval in which an estimated value of the delay is located;

determining a corresponding arrival moment of the electromagnetic signals and a corresponding arrival moment of the ultrasonic signals according to the determined delay increase interval; and obtaining the delay between the electromagnetic signals and the ultrasonic signals according to the determined arrival moment of the electromagnetic signals and the determined arrival moment of the ultrasonic signals.

14. The detection method according to claim 13, wherein performing the identification on the insulation defect picture according to the spatial coordinates, the two-dimensional pixel coordinates, the electromagnetic wave intensity, and the ultrasonic intensity comprises:

marking the insulation defect location in the insulation defect picture according to the two-dimensional pixel coordinates of the insulation defect location;

matching a distance between each of the at least three ultrasonic sensors and the insulation defect location, a plurality of electromagnetic wave intensities, and a plurality of ultrasonic intensities with the marked insulation defect location; and displaying a matched distance between an ultrasonic sensor of the at least three ultrasonic sensors and the insulation defect location, a matched electromagnetic wave intensity, and a matched ultrasonic intensity at the insulation defect location in the insulation defect picture.

15. The detection method according to claim 13, wherein performing the extraction on the ultrasonic signals to obtain the corresponding arrival moments of the ultrasonic signals comprises:

obtaining average energy of the ultrasonic signals according to the ultrasonic signals detected for a duration;

dividing the duration into a plurality of first preset time periods;

obtaining an energy curve of the ultrasonic signals according to the average energy of the ultrasonic signals and energy of ultrasonic signals within a first preset time period among the plurality of first preset time periods;

screening out, according to the energy curve of the ultrasonic signals, an ultrasonic signal corresponding to a minimal value of the energy curve of the ultrasonic signals within the first preset time period; and obtaining an arrival moment of the ultrasonic signal according to the ultrasonic signal corresponding to the minimal value of the energy curve of the ultrasonic signals; and wherein performing the extraction on the electromagnetic signals to obtain the corresponding arrival moments of the electromagnetic signals comprises:

obtaining, according to a signal-to-noise ratio of a current detection environment, a threshold scaling coefficient with which the electromagnetic wave sensor detects the electromagnetic signals;

obtaining an electromagnetic detection threshold according to the threshold scaling coefficient and the electromagnetic signals within the duration;

dividing the duration into a plurality of second preset time periods;

screening out, according to the plurality of second preset time periods and the electromagnetic detection threshold, an electromagnetic signal which reaches the electromagnetic detection threshold for a first time within a second preset time period among the plurality of second preset time periods; and determining a corresponding arrival moment of the electromagnetic signal according to the electromagnetic signal reaching the electromagnetic detection threshold for the first time.

16. The detection method according to claim 13, wherein determining the delay between the electromagnetic signals and the ultrasonic signals based on the discharge characteristic of the insulation defect location, the arrival moments of the electromagnetic signals and the arrival moments of the ultrasonic signals comprises:

obtaining a correlation accumulation factor based on the arrival moments of the electromagnetic signals, the arrival moments of the ultrasonic signals, a propagation speed of the electromagnetic signals, and the preset minimum delay resolution, wherein the following relationship is satisfied:

$$Q(t) = \sum_{i''=1}^{a} \sum_{j''=1}^{b} \left[ \frac{\Delta t / v'}{\left| T''_{ult,i} - \left( T''_{ele,j} + t/v' \right) \right|} \right]_{rounding}$$

wherein $Q(t)$ denotes the correlation accumulation factor, a denotes a number of the arrival moments of the ultrasonic signals, b denotes a number of the arrival moments of the electromagnetic signals, i'' denotes a serial number of an ultrasonic signal ordered according to detection time, j'' denotes a serial number of an electromagnetic signal ordered according to the detection time, $\Delta t$ denotes the preset minimum delay resolution, v' denotes the propagation speed of the electromagnetic signals, $T_{ult,i''}$ denotes an $i''^{th}$ arrival moment of the ultrasonic signals, $T_{ele,j''}$ denotes a $j''^{th}$ arrival moment of the electromagnetic signals, and t denotes the estimated value of the delay between the electromagnetic signals and the ultrasonic signals;

calculating a maximum value of the correlation accumulation factor to obtain the estimated value of the delay.

17. The detection method according to claim 13, wherein obtaining the ultrasonic intensity of the insulation defect location according to the detection result of the detection unit comprises:

collecting a temperature of a current environment and a humidity of the current environment;

obtaining an attenuation coefficient of an ultrasonic wave in the current environment based on the temperature and the humidity;

obtaining, according to the obtained arrival moments of the ultrasonic signals, signal amplitudes corresponding to different arrival moments;

performing maximum-value screening on the signal amplitudes corresponding to different arrival moments to obtain an ultrasonic detection intensity; and obtaining the ultrasonic intensity of the insulation defect location according to the distance between the insulation defect location and each of the at least three ultrasonic sensors, the ultrasonic detection intensity, and the attenuation coefficient.

18. The detection method according to claim 13, wherein the detection apparatus further comprises ultrasonic conditioning circuits, wherein a number of the ultrasonic conditioning circuits matches a number of the at least three ultrasonic sensors, and each of the ultrasonic conditioning circuits comprises a noise amplification circuit and an amplification and filter circuit which are connected to each other;

wherein an input terminal of the noise amplification circuit is connected to an ultrasonic sensor among the at least three ultrasonic sensors, the noise amplification circuit is configured to perform signal amplification on a detection result of the ultrasonic sensor, an output terminal of the amplification and filter circuit is connected to the processing unit, and the amplification and filter circuit is configured to amplify and filter a signal outputted from the noise amplification circuit.

19. The detection method according to claim 13, wherein obtaining the spatial coordinates of the insulation defect location according to the distance between the insulation defect location and each of the at least three ultrasonic sensors and a distance between adjacent ultrasonic sensors of the at least three ultrasonic sensors comprises:

obtaining a delay between different ultrasonic signals based on a high-order cumulant method and the ultrasonic signals detected by the at least three ultrasonic sensors;

obtaining the distance between the each of the at least three ultrasonic sensors and the insulation defect location according to the delay between different ultrasonic signals;

establishing a three-dimensional spatial coordinate system, and obtaining a spatial coordinate relationship of the insulation defect location according to the distance between adjacent ultrasonic sensors; and determining the spatial coordinates of the insulation defect location according to the distance between the each of the at least three ultrasonic sensors and the insulation defect location in conjunction with the spatial coordinate relationship.

20. The detection method according to claim 19, wherein obtaining the delay between different ultrasonic signals based on the high-order cumulant method and the ultrasonic signals detected by the at least three ultrasonic sensors comprises:

combining the at least three ultrasonic sensors in pairs to form a plurality of ultrasonic sensor groups;

constructing a cumulant coefficient for ultrasonic signals detected by each of plurality of ultrasonic sensor groups;

calculating a maximum value of all cumulant coefficients to obtain the delay between ultrasonic signals detected by two ultrasonic sensors in the each of plurality of ultrasonic sensor groups.

\* \* \* \* \*